United States Patent
Nishino et al.

(10) Patent No.: US 11,367,611 B2
(45) Date of Patent: Jun. 21, 2022

(54) FILM FORMING METHOD AND FILM FORMING APPARATUS

(71) Applicant: TOKYO ELECTRON LIMITED, Tokyo (JP)

(72) Inventors: Yuji Nishino, Oshu (JP); Jun Sato, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 271 days.

(21) Appl. No.: 16/357,292

(22) Filed: Mar. 18, 2019

(65) Prior Publication Data
US 2019/0287787 A1    Sep. 19, 2019

(30) Foreign Application Priority Data

Mar. 19, 2018  (JP) ............................. JP2018-051272

(51) Int. Cl.
*C23C 16/455* (2006.01)
*C23C 16/52* (2006.01)
*C23C 16/40* (2006.01)
*H01L 21/02* (2006.01)
(Continued)

(52) U.S. Cl.
CPC ........ *H01L 21/0228* (2013.01); *C23C 16/401* (2013.01); *C23C 16/4554* (2013.01); *C23C 16/45536* (2013.01); *C23C 16/45542* (2013.01); *C23C 16/45544* (2013.01); *C23C 16/45548* (2013.01); *C23C 16/45553* (2013.01); *C23C 16/52* (2013.01); *H01J 37/32779* (2013.01); *H01L 21/02164* (2013.01); *H01L 21/02211* (2013.01); *H01L 21/02274* (2013.01); *H01L 21/68764* (2013.01); *H01L 21/68771* (2013.01)

(58) Field of Classification Search
CPC .......... H01L 21/0228; H01L 21/68764; H01L 21/02164; H01L 21/02211; H01L 21/02274; H01L 21/68771; H01L 21/02219; C23C 16/45548; C23C 16/45542; C23C 16/4554; C23C 16/45536; C23C 16/45538; C23C 16/45544; C23C 16/52; C23C 16/45553; C23C 16/401; C23C 16/402; C23C 16/45551; C23C 16/045; H01J 37/32779; H01J 37/32761; H01J 37/32752
See application file for complete search history.

(56) References Cited

U.S. PATENT DOCUMENTS

2013/0164942 A1* 6/2013 Kato ................. C23C 16/45536
                                                          438/758
2017/0125238 A1* 5/2017 Hasebe ............... H01L 21/0228

FOREIGN PATENT DOCUMENTS

| JP | 2008-523640 A | 7/2008 |
| JP | 2013-135154 A | 7/2013 |
| JP | 2017-092098 A | 5/2017 |

(Continued)

*Primary Examiner* — Dah-Wei D. Yuan
*Assistant Examiner* — Nga Leung V Law
(74) *Attorney, Agent, or Firm* — Nath, Goldberg & Meyer; Jerald L. Meyer; Tanya E. Harkins

(57) ABSTRACT

There is provided a film forming method of embedding a film in a groove formed in a front surface of a substrate, which includes: depositing an in-conformal film in the groove formed in the front surface of the substrate while forming a V-like cross-sectional shape in the groove; and embedding a conformal film in the groove by depositing the conformal film.

9 Claims, 16 Drawing Sheets

(51) Int. Cl.
*H01L 21/687* (2006.01)
*H01J 37/32* (2006.01)

(56) References Cited

FOREIGN PATENT DOCUMENTS

| JP | 2017-201653 A | 11/2017 |
| KR | 1020130075695 A | 7/2013 |
| KR | 1020170124457 A | 11/2017 |

* cited by examiner

Rotation direction of rotary table 2

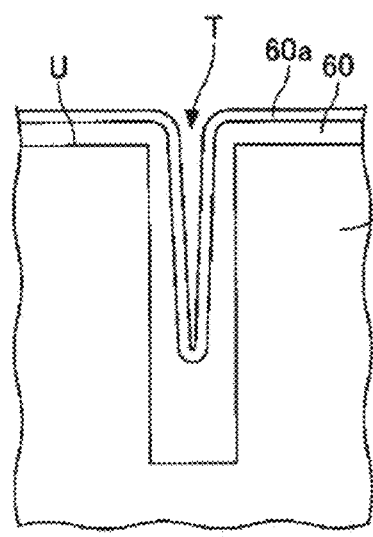 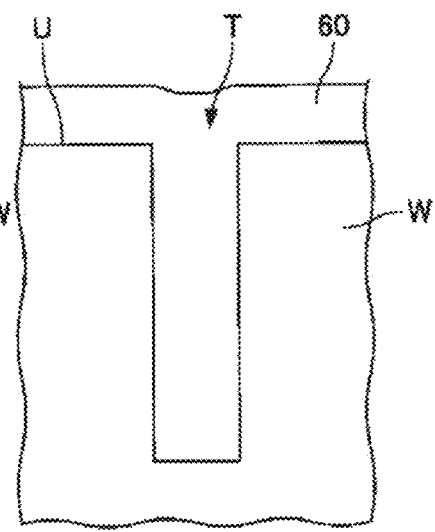

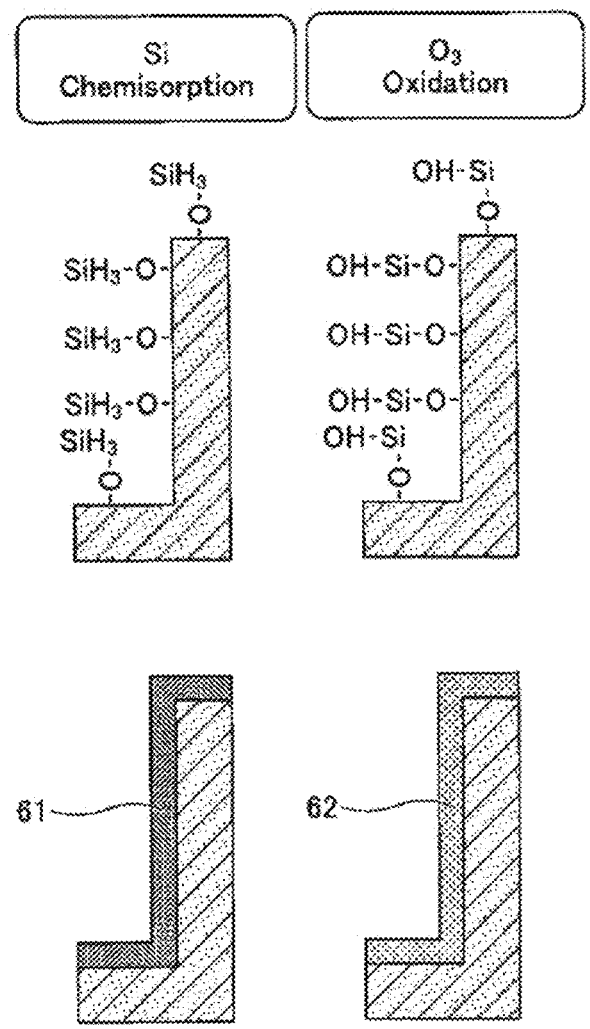

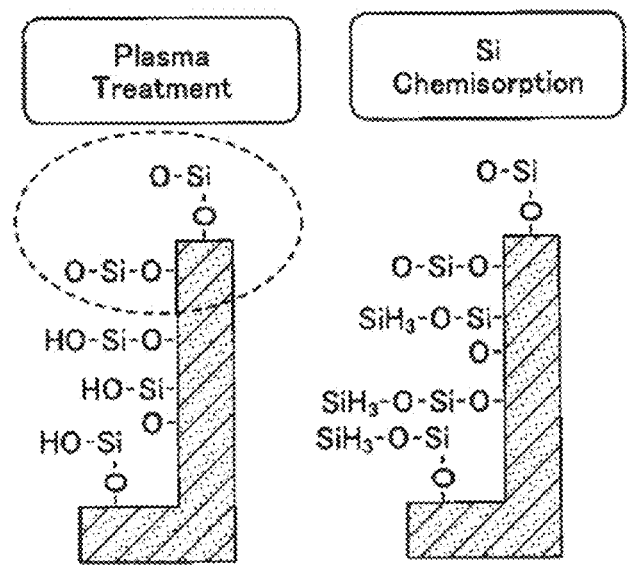
FIG. 10C  FIG. 10D
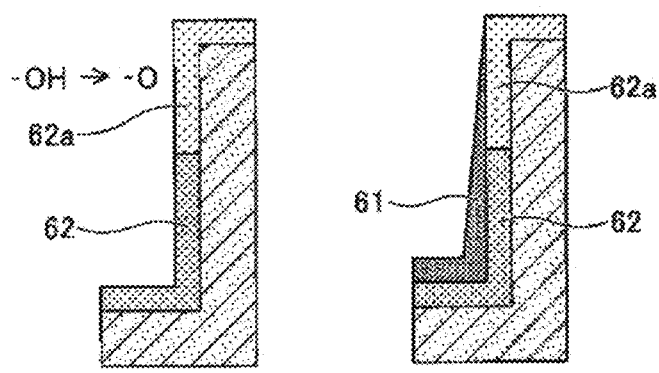

FIG. 11A
Si Chemisorption
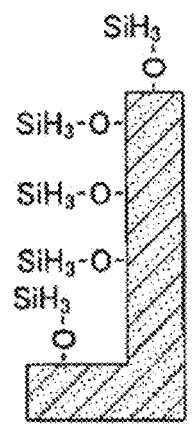
FIG. 11C
Plasma Treatment
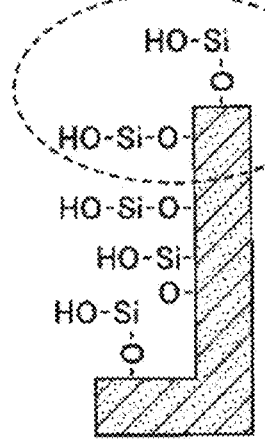
FIG. 11B
O₃ Oxidation
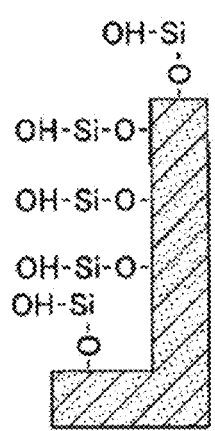
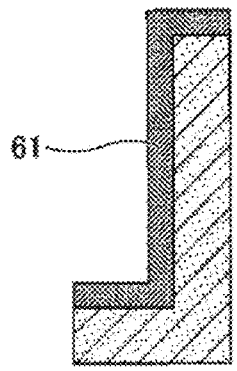
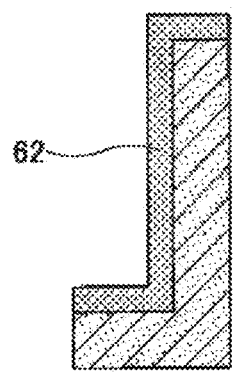
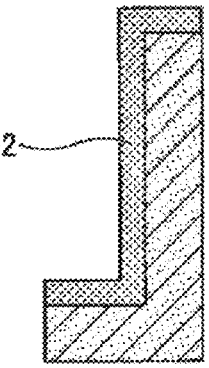

FILM FORMING METHOD AND FILM FORMING APPARATUS

CROSS-REFERENCE TO RELATED APPLICATION

This application is based upon and claims the benefit of priority from Japanese Patent Application No. 2018-051272, filed on Mar. 19, 2018, the entire contents of which are incorporated herein by reference.

TECHNICAL FIELD

The present disclosure relates to a film forming method and a film forming apparatus.

BACKGROUND

Conventionally, there is known a method of forming a film by a reaction product of a first reaction gas and a second reaction gas which reacts with the first reaction gas. In this film forming method, the reaction product is produced by allowing hydroxyl groups to be adsorbed onto an inner surface of a recess formed in a substrate in a desired distribution, supplying the first reaction gas to the substrate onto which the hydroxyl groups are adsorbed, and supplying the second reaction gas to the substrate onto which the first reaction gas is adsorbed.

By applying such a film forming method so that a large number of hydroxyl groups are distributed on the bottom surface of the recess and a small number of hydroxyl groups are distributed in an upper portion of the recess and in an upper surface of the substrate, it is possible to perform film formation in which the recess is filled while maintaining a V-like cross-sectional shape so that the opening of the recess is not blocked. This makes it possible to perform film formation while suppressing generation of a void.

However, the film formation performed while maintaining the V-like cross-sectional shape is required to be performed by setting a slow deposition rate so that the film does not block the opening of the recess. This results in a degradation of productivity and increases the consumption of a raw material gas. This poses a problem in which the cost becomes high.

SUMMARY

Some embodiments of the present disclosure provide a film forming method and a film forming apparatus capable of increasing a deposition rate and reducing a consumption of raw material gas while realizing film formation that suppresses generation of a void.

According to one embodiment of the present disclosure, there is provided a film forming method of embedding a film in a groove formed in a front surface of a substrate, which includes: depositing an in-conformal film in the groove formed in the front surface of the substrate while forming a V-like cross-sectional shape in the groove; and embedding a conformal film in the groove by depositing the conformal film.

According to another embodiment of the present disclosure, there is provided a film forming apparatus including: a processing chamber; a rotary table provided inside the processing chamber and configured to mount a substrate thereon along a circumferential direction; a raw material gas supply part provided above the rotary table and configured to supply a raw material gas toward the rotary table; a reaction gas supply part provided at a downstream side of the raw material gas supply part in a rotational direction of the rotary table and configured to supply a reaction gas, which reacts with the raw material gas to generate a reaction product, toward the rotary table; a modifying gas supply part provided at a downstream side of the reaction gas supply part in the rotational direction of the rotary table and configured to supply a modifying gas for modifying the reaction product toward the rotary table; a plasma generator configured to activate the modifying gas with a plasma; and a controller configured to perform a control for carrying out depositing an in-conformal film in a groove formed in a surface of the substrate while forming a V-like cross-sectional shape in the groove, and embedding a conformal film in the groove by depositing the conformal film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 9A to 9F are views for explaining an example of a film forming method according to a first embodiment of the present disclosure.

FIGS. 10A to 10D are views showing an in-conformal film forming process of an example of a film forming method according to a second embodiment of the present disclosure.

FIGS. 11A to 10C are views showing a conformal film forming process of an example of the film forming method according to the second embodiment of the present disclosure.

DETAILED DESCRIPTION

Figure 1:
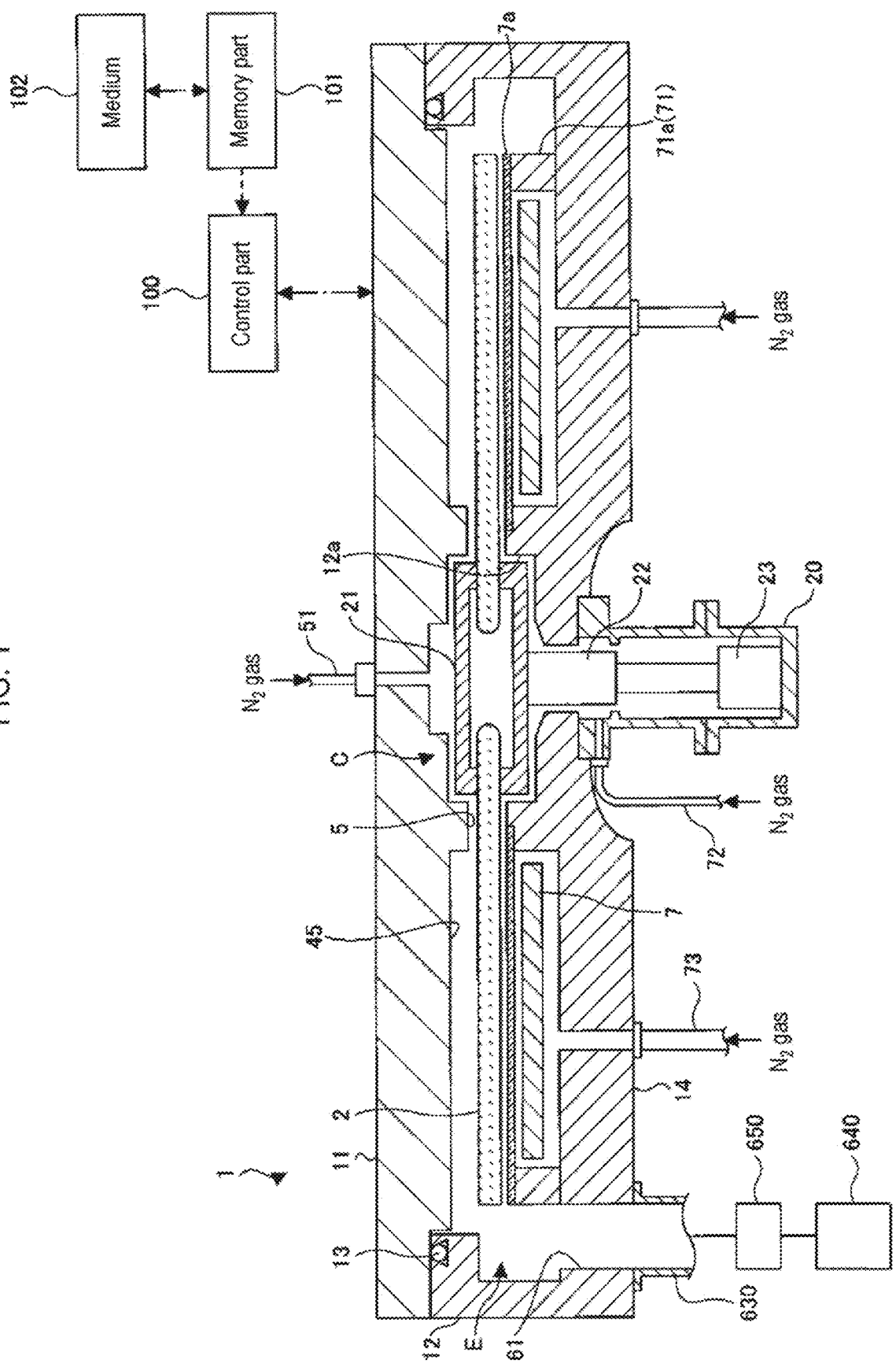
FIG. 1 is a schematic sectional view showing a film forming apparatus according to an embodiment of the present disclosure.

Hereinafter, modes for carrying out the present disclosure will be described with reference to the figures. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Film Forming Apparatus]

First, a film forming apparatus according to an embodiment of the present disclosure will be described with reference to FIGS. 1 to 3. The film forming apparatus includes a flat vacuum container 1 having a substantially-circular planar shape, and a rotary table 2 provided inside the vacuum container 1 and having a rotational center coinciding with the center of the vacuum container 1. The vacuum container 1 includes a container body 12 having a cylindrical shape with bottom, and a top plate 11 airtightly and removably arranged on an upper surface of the container body 12 via a seal member 13 (FIG. 1) such as, for example, an O-ring or the like.

The rotary table 2 is fixed to a cylindrical core portion 21 at the central portion thereof. The core portion 21 is fixed to an upper end of a rotation shaft 22 extending in the vertical direction. The rotation shaft 22 extends through a bottom portion 14 of the vacuum chamber 1. A lower end of the rotation shaft 22 is attached to a driving part 23 configured to rotate the rotation shaft 22 (FIG. 1) about a vertical axis. The rotation shaft 22 and the driving part 23 are accommodated in a tubular case body 20 having an opened upper surface. A flange portion provided on the upper surface of the case body 20 is airtightly attached to the lower surface of the bottom portion 14 of the vacuum container 1, whereby airtightness is maintained between an internal atmosphere of the case body 20 and the external atmosphere.

Figure 2:
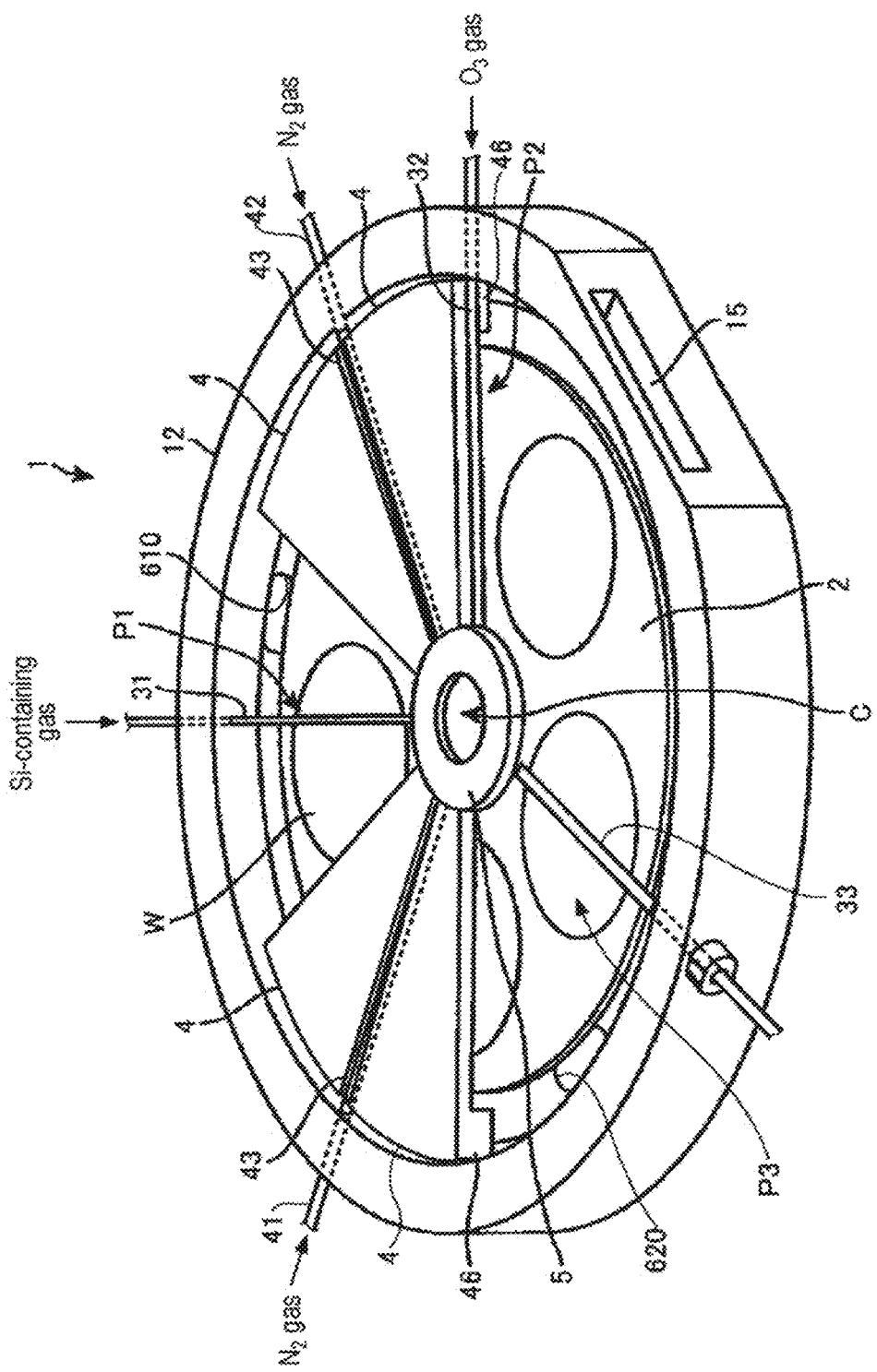
FIG. 2 is a schematic perspective view showing an internal configuration of a vacuum container of the film forming apparatus shown in FIG. 1.
Figure 3:
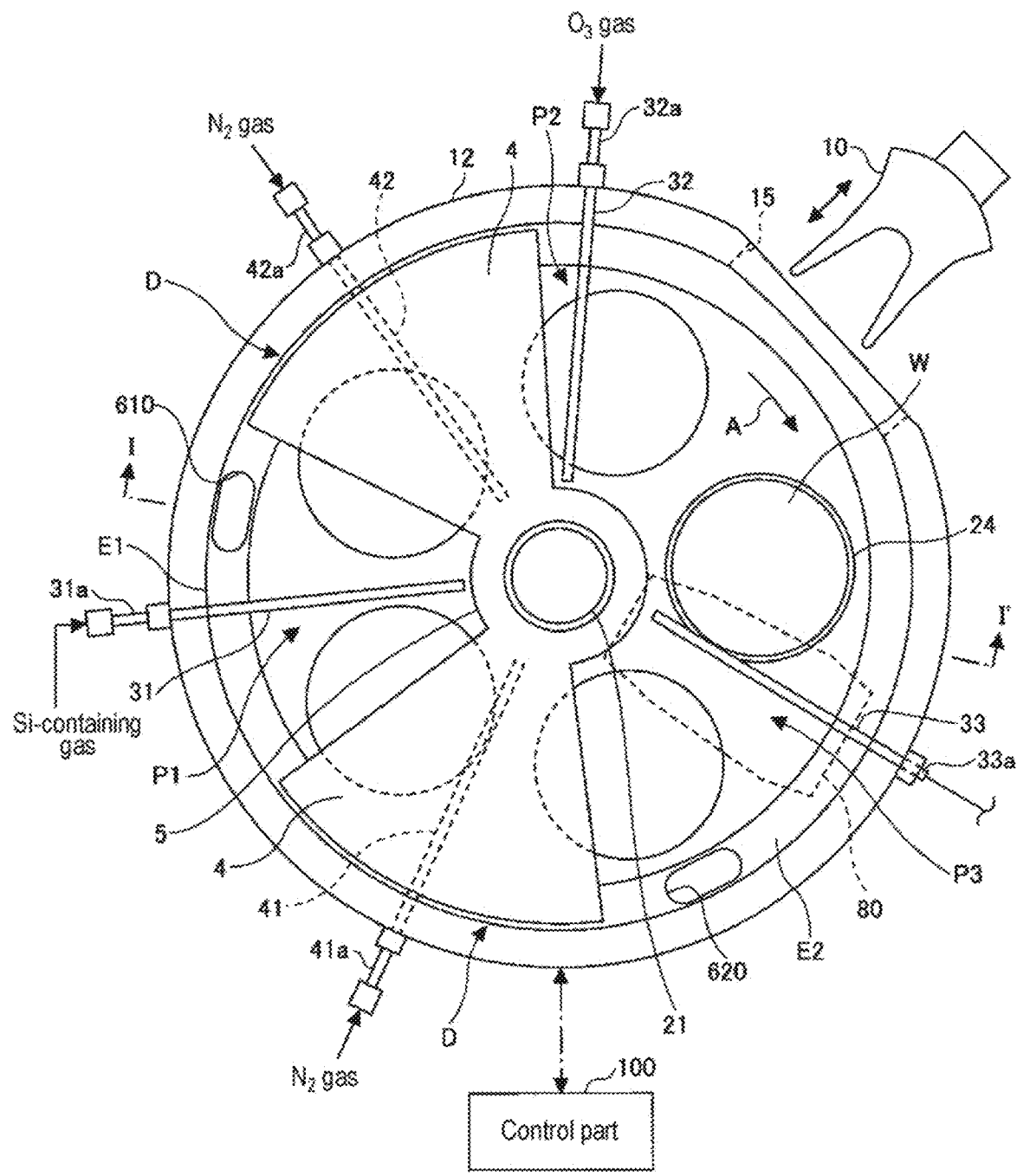
FIG. 3 is a schematic plan view showing the internal configuration of the vacuum container of the film forming apparatus shown in FIG. 1.

In a front surface of the rotary table 2, as shown in FIGS. 2 and 3, there are formed circular recesses 24 in which a plurality of (five, in the illustrated example) semiconductor wafers (hereinafter referred to as "wafers") W used as substrates is mounted. In FIG. 3, for the sake of convenience in illustration, the wafer W is shown to be mounted in only one recess 24. The recess 24 has an inner diameter that is slightly larger (for example, 4 mm) than the diameter of the wafer W, and a depth that is substantially equal to the thickness of the wafer W. Therefore, when the wafer W is accommodated in the recess 24, the front surface of the wafer W and the front surface of the rotary table 2 (in a region where the wafer W is not mounted) have the same height. Through-holes (not shown) through which, for example, three lift pins for moving the wafer W up and down while supporting a back surface of the wafer W penetrate are formed in the bottom surface of the recess 24.

FIGS. 2 and 3 are views for explaining an internal structure of the vacuum container 1. For the sake of convenience in description, the illustration of the top plate 11 is omitted. As shown in FIGS. 2 and 3, a reaction gas nozzle 31, a reaction gas nozzle 32, separation gas nozzles 41 and 42 and a plasma gas nozzle 33, which are made of, for example, quartz, are disposed above the rotary table 2 in a mutually spaced-apart relationship in the circumferential direction of the vacuum container 1 (in a rotational direction of the rotary table 2) (indicated by an arrow A in FIG. 3). In the illustrated example, the plasma gas nozzle 33, the separation gas nozzle 41, the reaction gas nozzle 31, the separation gas nozzle 42 and the reaction gas nozzle 32 are arranged in this order in the clockwise direction (the rotational direction of the rotary table 2) from a transfer port 15 to be described later. These nozzles 31, 32, 33, 41 and 42 are introduced into the vacuum container 1 from an outer peripheral wall of the vacuum container 1 by fixing gas introduction ports 31a, 32a, 33a, 41a and 42a (FIG. 3), which are base end portions of the respective nozzles 31, 32, 33, 41 and 42, to the outer peripheral wall of the container body 12. The nozzles 31, 32, 33, 41 and 42 are attached so as to extend horizontally with respect to the rotary table 2 along a radial direction of the container body 12.

Incidentally, a plasma generator 80 is provided above the plasma gas nozzle 33 as indicated in a simplified manner by a broken line in FIG. 3. The plasma generator 80 will be described later.

In the present embodiment, the reaction gas nozzle 31 is coupled to a supply source (not shown) of a Si (silicon)-containing gas as a first reaction gas via a pipe (not shown), a flow rate controller (not shown) and the like. The reaction gas nozzle 32 is coupled to a supply source (not shown) of an oxidizing gas as a second reaction gas via a pipe (not shown), a flow rate controller (not shown) and the like. Each of the separation gas nozzles 41 and 42 is coupled to a supply source (not shown) of a nitrogen ($N_2$) gas as a separation gas via a pipe (not shown), a flow rate control valve (not shown) and the like.

In the present embodiment, an organic aminosilane gas is used as the Si-containing gas, and an $O_3$ (ozone) gas is used as the oxidizing gas.

In the reaction gas nozzles 31 and 32, a plurality of gas discharge holes 31h and 32h formed to be opened toward the rotary table 2 are arranged at intervals of, for example, 10 mm, along the length direction of the reaction gas nozzles 31 and 32, respectively. A region below the reaction gas nozzle 31 serves as a first processing region P1 in which the Si-containing gas is adsorbed onto the wafer W. A region below the reaction gas nozzle 32 serves as a second processing region P2 in which the Si-containing gas adsorbed onto the wafer W in the first processing region P1 is oxidized. A region below the plasma gas nozzle 33 serves as a third processing region P3 in which a reaction product generated by oxidizing the Si-containing gas in the second processing region P2 is plasma-processed.

Referring to FIGS. 2 and 3, two convex portions 4 are provided inside the vacuum container 1. In order to form separation regions D in cooperation with the separation gas nozzles 41 and 42, the convex portions 4 are attached to a back surface of the top plate 11 so as to protrude toward the rotary table 2 as will be described later. In addition, each of the convex portions 4 has a fan-like planar shape with the apex portion thereof cut in an arc shape. In the present embodiment, an inner circular arc of each of the convex portions 4 is connected to a protrusion portion 5 (to be described later), and an outer circular arc of each of the convex portions 4 is arranged so as to extend along an inner circumferential surface of the container body 12 of the vacuum container 1.

Figure 4:
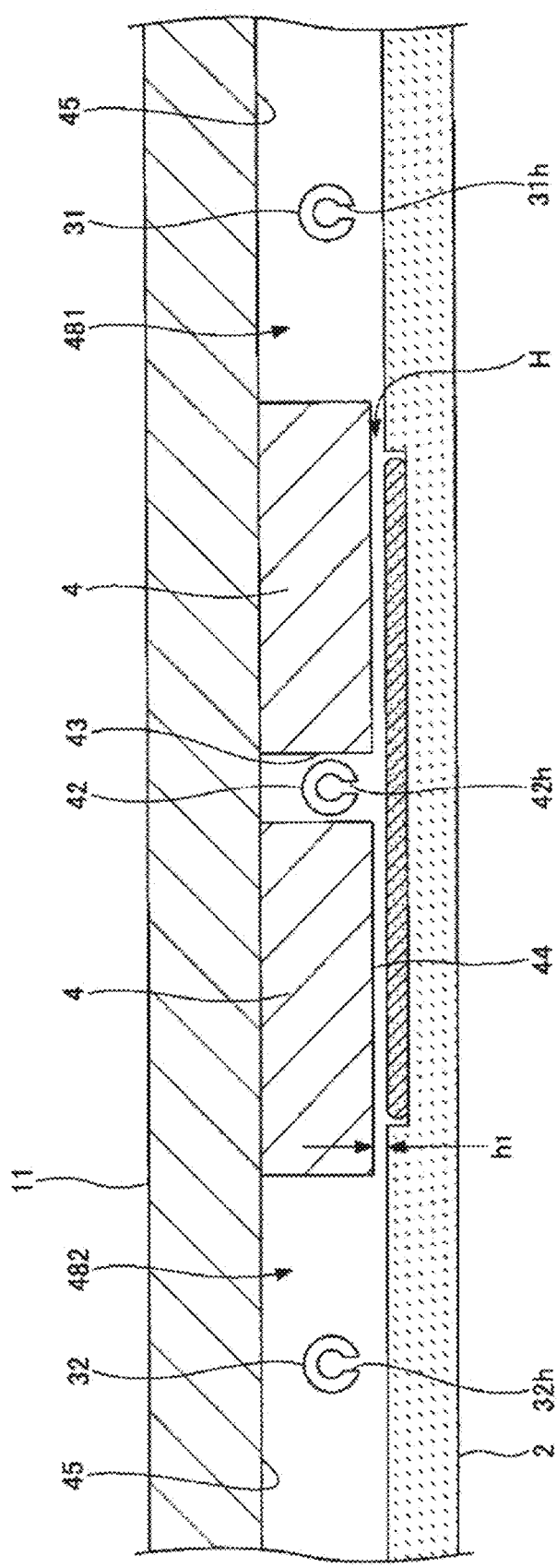
FIG. 4 is a schematic sectional view of the vacuum container, which is taken along a concentric circle of a rotary table rotatably provided inside the vacuum container of the film forming apparatus shown in FIG. 1.

FIG. 4 shows a cross section of the vacuum container 1, which is taken along a concentric circle of the rotary table 2 from the reaction gas nozzle 31 to the reaction gas nozzle 32. As shown in FIG. 4, the convex portions 4 are attached to the back surface of the top plate 11. Therefore, inside the vacuum container 1, there are present a flat low ceiling surface 44 (a first ceiling surface) as a lower surface of the convex portion 4 and a high ceiling surface 45 (a second ceiling surface) located higher than the low ceiling surface 44 at both sides of the low ceiling surface 44 in the circumferential direction. The low ceiling surface 44 has a fan-like planar shape in which the apex portion is cut in an arc shape. As shown in FIG. 4, at the center of one of the convex portions 4 in the circumferential direction, a groove 43 is formed so as to extend in the radial direction. The separation gas nozzle 42 is accommodated in the groove 43. Similarly, a groove 43 is also formed in the other convex portion 4. The separation gas nozzle 41 is accommodated in the respective groove 43. In addition, the reaction gas nozzles 31 and 32 are provided in a space below the high ceiling surface 45. The reaction gas nozzles 31 and 32 are provided in the vicinity of the wafer W while being spaced apart from the high ceiling surface 45. For the sake of convenience in description, as shown in FIG. 4, a space below the high ceiling surface 45 where the reaction gas nozzle 31 is provided is denoted by reference numeral 481, and a space below the high ceiling surface 45 where the reaction gas nozzle 32 is provided is denoted by reference numeral 482.

Furthermore, in each of the separation gas nozzles 41 and 42 accommodated in the respective grooves 43 of the convex portions 4, a plurality of gas discharge holes (shown only reference numeral 42h in FIG. 4) formed to be opened toward the rotary table 2 is arranged at intervals of, for example, 10 mm, along the length direction of each of the separation gas nozzles 41 and 42.

The low ceiling surface 44 forms a separation space H as a narrow space with respect to the rotary table 2. When an $N_2$ gas is supplied from the gas discharge holes 42h of the separation gas nozzle 42, the $N_2$ gas flows toward the space 481 and the space 482 through the separation space H. At this time, an internal pressure of the separation space H can be made higher than internal pressures of the spaces 481 and 482 by the $N_2$ gas because the volume of the separation space H is smaller than those of the spaces 481 and 482. That is to say, the separation space H having a high pressure is formed between the spaces 481 and 482. The $N_2$ gas flowing out from the separation space H into the spaces 481 and 482 acts as a counter flow against the Si-containing gas flowing from the first processing region P1 and the oxidizing gas flowing from the second processing region P2. Therefore, the Si-containing gas coming from the first processing region P1 and the oxidizing gas coming from the second processing region P2 are separated by the separation space H. With this configuration, the Si-containing gas and the oxidizing gas are prevented from mixing and reacting with each other in the vacuum container 1.

In some embodiments, a height hi of the low ceiling surface 44 from the upper surface of the rotary table 2 may be set at a height suitable for making the internal pressure of the separation space H higher than the internal pressures of the spaces 481 and 482 in consideration of the internal pressure of the vacuum container 1, a rotation speed of the rotary table 2, a supply amount of the separation gas ($N_2$ gas) and the like during film formation.

On the other hand, the protrusion portion 5 (FIGS. 2 and 3) formed to surround an outer periphery of the core portion 21 for fixing the rotary table 2 is provided on the lower surface of the top plate 11. In the present embodiment, the protrusion portion 5 is continuous with portions at the rotational center side in the convex portions 4. A lower surface of the protrusion portion 5 is formed at the same height as the low ceiling surface 44.

Figure 5:
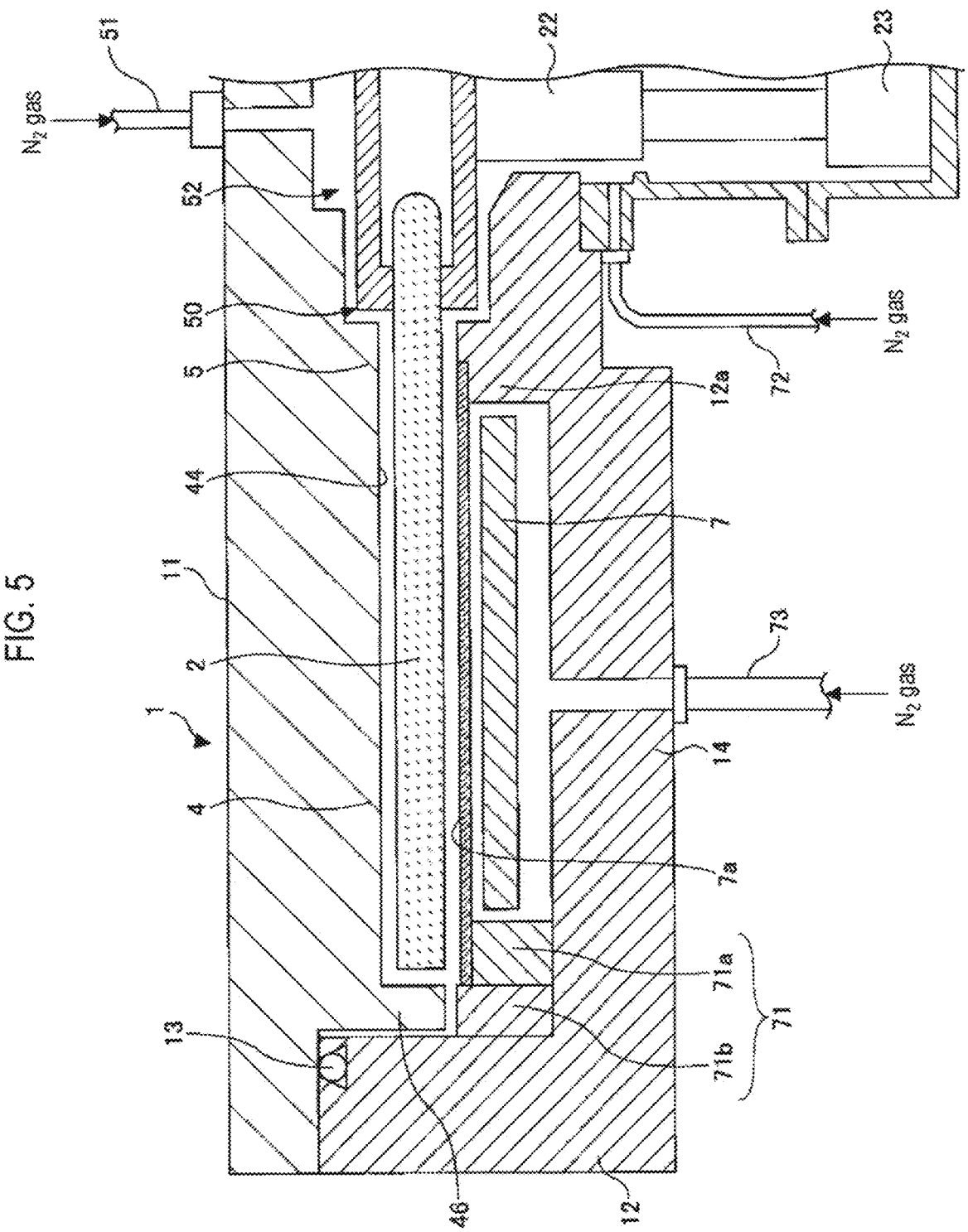
FIG. 5 is another schematic sectional view of the film forming apparatus shown in FIG. 1.

FIG. 1 referred to above is a sectional view taken along the line I-I' in FIG. 3 and shows a region where the high ceiling surface 45 is provided. On the other hand, FIG. 5 is a sectional view showing a region where the low ceiling surface 44 is provided. As shown in FIG. 5, a bent portion 46 bent in an L-like shape so as to face an outer end surface of the rotary table 2 is formed in a peripheral edge portion of the fan-like convex portion 4 (a portion on an inner peripheral side of the vacuum container 1). Just like the convex portion 4, the bent portion 46 suppresses the entry of the reaction gases from both sides of the separation region D, thereby suppressing the mixing of both reaction gases. Since the fan-like convex portion 4 is provided on the top plate 11 and the top plate 11 can be removed from the container body 12, there is a gap between an outer circumferential surface of the bent portion 46 and the container body 12. A gap between an inner circumferential surface of the bent portion 46 and an outer end surface of the rotary table 2, and a gap between the outer circumferential surface of the bent portion 46 and the container body 12 may be set to be the same as the height hi of the low ceiling surface 44 with respect to the upper surface of the rotary table 2.

In the separation region D, as shown in FIG. 5, the inner peripheral wall of the container body 12 is formed as a vertical surface close to the outer circumferential surface of the bent portion 46. However, in a portion other than the separation region D, as shown in FIG. 1, for example, the inner peripheral wall of the container body 12 is recessed outward from a portion facing the outer end surface of the rotary table 2 to the bottom portion 14. Hereinafter, for the sake of convenience in description, the recessed portion having a substantially rectangular cross-sectional shape is referred to as an exhaust region E. Specifically, an exhaust region communicating with the first processing region P1 is referred to as a first exhaust region E1, and an exhaust region communicating with the second processing region P2 is referred to as a second exhaust region E2. As shown in FIGS. 1 to 3, a first exhaust port 610 and a second exhaust port 620 are formed in bottom portions of the first exhaust region E1 and the second exhaust region E2, respectively. As shown in FIG. 1, the first exhaust port 610 and the second exhaust port 620 are coupled to, for example, a vacuum pump 640 used as a vacuum evacuation means, via an exhaust pipe 630, respectively. In FIG. 1, reference numeral 650 denotes a pressure controller.

As shown in FIGS. 1 and 4, a heater unit 7 serving as a heating means is provided in a space between the rotary table 2 and the bottom portion 14 of the vacuum container 1. The wafer W mounted on the rotary table 2 is heated via the rotary table 2 to a temperature (for example, 450 degrees C.) determined by a process recipe. On the lower side of the rotary table 2 in the vicinity of the peripheral edge of the rotary table 2, a ring-shaped cover member 71 is provided in order to isolate an atmosphere formed from a space above the rotary table 2 to the exhaust regions E1 and E2 from an atmosphere where the heater unit 7 is placed and to suppress the entry of a gas into a region below the rotary table 2 (FIG.

5). The cover member 71 includes an inner member 71a and an outer member 71b. The inner member 71a is provided so as to face the outer peripheral portion of the rotary table 2 and a portion outward of the outer peripheral portion from below. The outer member 71b is provided between the inner member 71a and the inner wall surface of the vacuum container 1. The outer member 71b is provided close to the bent portion 46 under the bent portion 46 formed in the outer peripheral portion of the convex portion 4 in the separation region D. The inner member 71a is provided under the outer peripheral portion of the rotary table 2 (and under a portion slightly outward of the outer peripheral portion) so as to surround the heater unit 7 over the entire circumference thereof.

In the bottom portion 14, a portion closer to the rotational center than a space where the heater unit 7 is disposed protrudes upward so as to approach the core portion 21 in the vicinity of the central portion of the lower surface of the rotary table 2, thereby forming a protrusion portion 12a. A narrow space is formed between the protrusion portion 12a and the core portion 21. Furthermore, a narrow space is formed between an inner circumferential surface of a through-hole through which the rotation shaft 22 passing through the bottom portion 14 passes and the rotation shaft 22. These narrow spaces communicate with the case body 20. A purge gas supply pipe 72 for supplying an $N_2$ gas as a purge gas into the narrow spaces to purge the narrow spaces is provided in the case body 20. In the bottom portion 14 of the vacuum container 1, a plurality of purge gas supply pipes 73 for purging the arrangement space of the heater unit 7 is provided under the heater unit 7 at predetermined angular intervals in the circumferential direction (only one purge gas supply pipe 73 is shown in FIG. 5). Furthermore, a lid member 7a for circumferentially covering a region between the inner peripheral wall of the outer member 71b (an upper surface of the inner member 71a) and an upper end portion of the protrusion portion 12a is provided between the heater unit 7 and the rotary table 2 in order to suppress the entry of a gas into the region where the heater unit 7 is provided. The lid member 7a may be made of, for example, quartz.

Furthermore, a separation gas supply pipe 51 is connected to the central portion of the top plate 11 of the vacuum container 1. The separation gas supply pipe 51 is configured to supply an $N_2$ gas as a separation gas to a space 52 between the top plate 11 and the core portion 21. The separation gas supplied to the space 52 is discharged toward the periphery along a surface at the side of a wafer mounting region in the rotary table 2 via a narrow gap 50 between the protrusion portion 5 and the rotary table 2. The space 50 can be maintained at a higher pressure than the space 481 and the space 482 by the separation gas. With this configuration, the Si-containing gas supplied to the first processing region P1 and the oxidizing gas supplied to the second processing region P2 are prevented by the space 50 from passing through a central region C and being mixed with each other. That is to say, the space 50 (or the central region C) may function similarly to the separation space H (or the separation region D).

As shown in FIGS. 2 and 3, a transfer port 15 through which the wafer W as a substrate is transferred between an external transfer arm 10 and the rotary table 2 is formed in a sidewall of the vacuum container 1. The transfer port 15 is opened and closed by a gate valve (not shown). In addition, the wafer W is delivered to and from the transfer arm 10 at a position where the recess 24 as the wafer mounting region of the rotary table 2 faces the transfer port 15. Thus, lift pins for penetrating the recess 24 to lift up the wafer W from the back surface thereof and an elevating mechanism (not shown) therefor are provided in a region corresponding to a delivery position under the rotary table 2.

Figure 6:
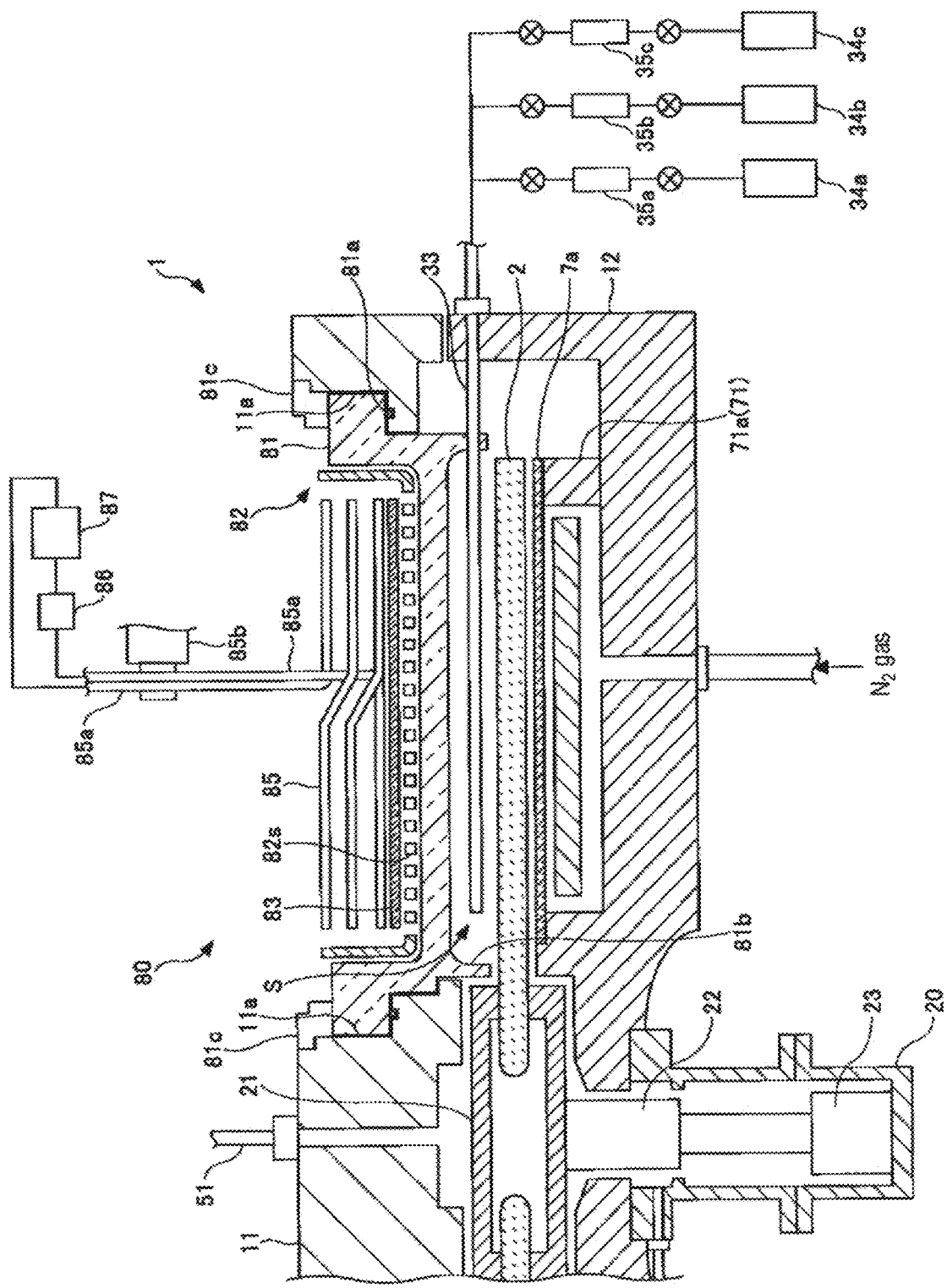
FIG. 6 is a schematic sectional view showing a plasma generation source provided in the film forming apparatus shown in FIG. 1.
Figure 7:
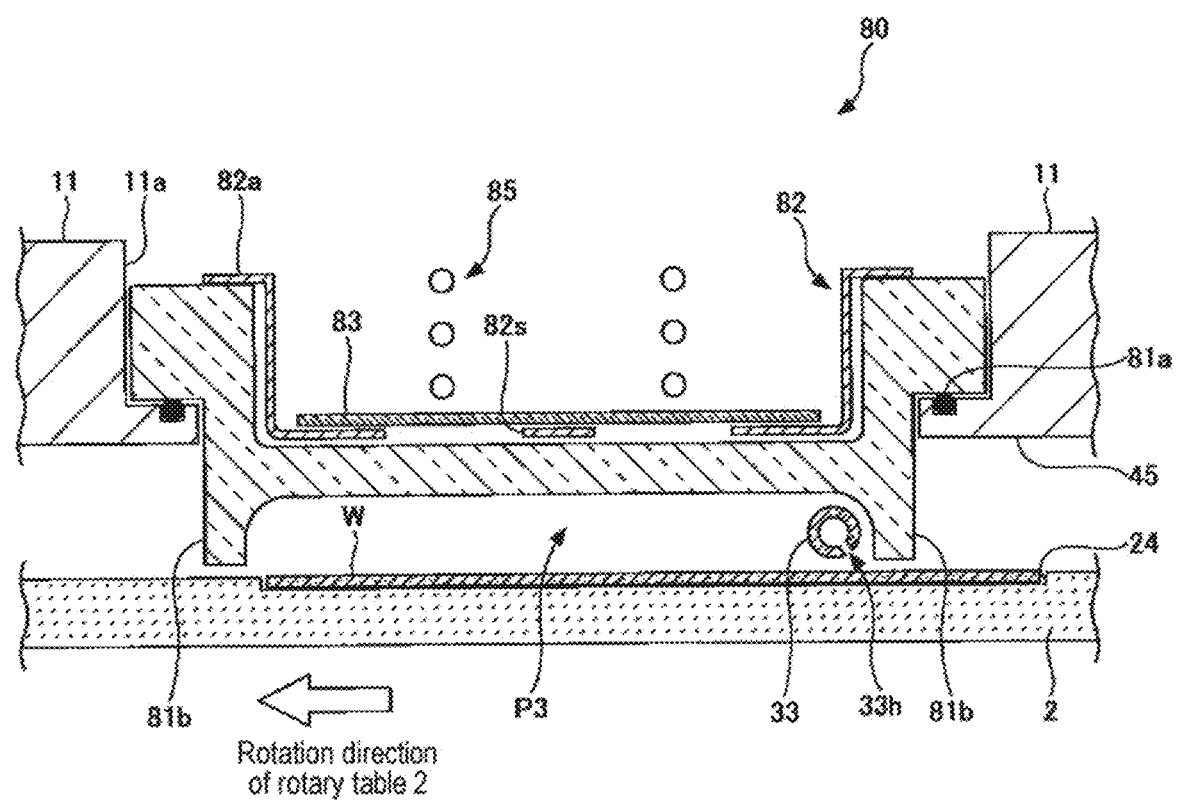
FIG. 7 is another schematic sectional view showing the plasma generation source provided in the film forming apparatus shown in FIG. 1.
Figure 8:
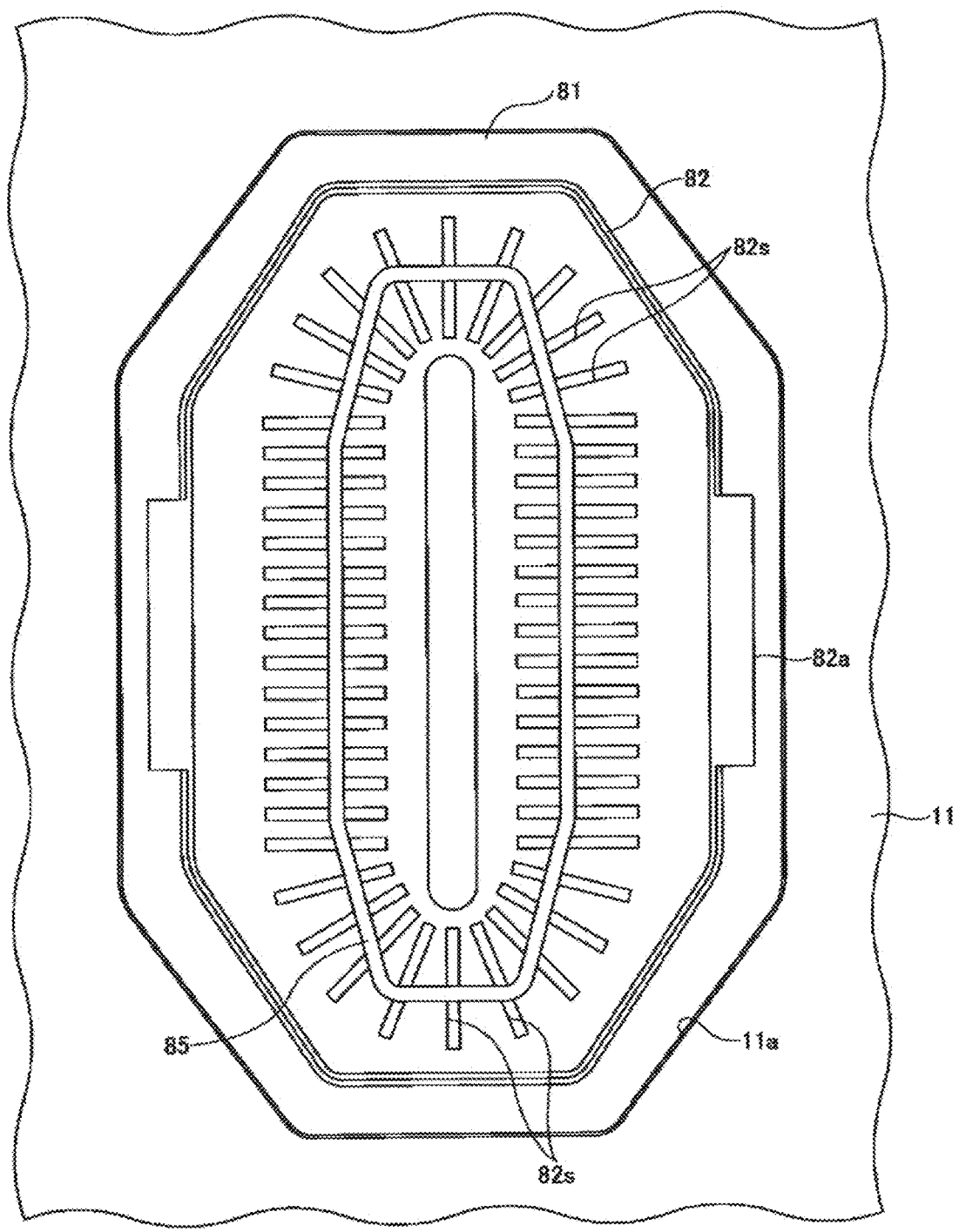
FIG. 8 is a schematic top view showing the plasma generation source provided in the film forming apparatus shown in FIG. 1.

Next, the plasma generator 80 will be described with reference to FIGS. 6 to 8. FIG. 6 is a schematic sectional view of the plasma generator 80, which is taken along the radial direction of the rotary table 2. FIG. 7 is a schematic sectional view of the plasma generator 80, which is taken along a direction perpendicular to the radial direction of the rotary table 2. FIG. 8 is a top view showing the outline of the plasma generator 80. For the sake of convenience in illustration, some of the parts are simplified in these figures.

Referring to FIG. 6, the plasma generator 80 includes a frame member 81, a Faraday shield plate 82, an insulating plate 83 and a coil-shaped antenna 85. The frame member 81 is made of a high-frequency permeable material and has a downwardly-recessed concave portion formed therein. The frame member 81 is fitted into an opening 11a formed in the top plate 11. The Faraday shield plate 82 is accommodated in the concave portion of the frame member 81 and has a substantially box-like shape with its upper portion opened. The insulating plate 83 is disposed on a bottom surface of the Faraday shield plate 82. The coil-shaped antenna 85 is supported above the insulating plate 83 and has a substantially octagonal planar shape.

The opening 11a of the top plate 11 has a plurality of stepped portions. A groove is formed over the entire circumference in one of the stepped portions of the opening 11a. A sealing member 81a such as, for example, an O-ring or the like, is fitted into the groove. On the other hand, the frame member 81 has a plurality of stepped portions corresponding to the respective stepped portions of the opening 11a. When the frame member 81 is fitted into the opening 11a, a back surface of one of the stepped portions of the frame member 81 makes contact with the sealing member 81a fitted into the groove of the opening 11a, whereby airtightness is maintained between the top plate 11 and the frame member 81. Furthermore, as shown in FIG. 6, a pressing member 81c is provided along an outer periphery of the frame member 81 fitted into the opening 11a of the top plate 11, whereby the frame member 81 is pressed downward against the top plate 11. Therefore, the airtightness between the top plate 11 and the frame member 81 is more reliably maintained.

A lower surface of the frame member 81 faces the rotary table 2 inside the vacuum container 1. On an outer periphery of the lower surface of the frame member 81, a protrusion portion 81b protruding downward (toward the rotary table 2) is formed over the entire circumference. A lower surface of the protrusion portion 81b is close to the front surface of the rotary table 2. A space S (hereinafter referred to as a third processing region P3) is defined above the rotary table 2 by the protrusion portion 81b, the front surface of the rotary table 2 and the lower surface of the frame member 81. A distance between the lower surface of the protrusion portion 81b and the front surface of the rotary table 2 may be substantially the same as the height hi of the low ceiling surface 44 from the upper surface of the rotary table 2 in the separation space H (FIG. 4).

In the third processing region P3, the plasma gas nozzle 33 passing through the protrusion portion 81b extends. In the present embodiment, as shown in FIG. 6, an argon gas supply source 34a filled with an argon (Ar) gas, an oxygen gas supply source 34b filled with an oxygen ($O_2$) gas and a hydrogen gas supply source 34c filled with a hydrogen (H2) gas are connected to the plasma gas nozzle 33. The Ar gas, the $O_2$ gas and the $H_2$ gas whose flow rates are controlled by respective flow rate controllers 35a, 35b and 35c are respectively supplied from the argon gas supply source 34a, the oxygen gas supply source 34b and the hydrogen gas supply source 34c to the third processing region P3 at a predetermined flow rate ratio (mixing ratio).

In the plasma gas nozzle 33, a plurality of discharge holes 33h is formed at predetermined intervals (for example, 10 mm) along the longitudinal direction of the plasma gas nozzle 33. The Ar gas or the like is discharged from the discharge holes 33h. As shown in FIG. 7, the discharge holes 33h are formed to be inclined from a direction perpendicular to the rotary table 2 toward the upstream side in the rotational direction of the rotary table 2. Therefore, the gas supplied from the plasma gas nozzle 33 is discharged in a direction opposite to the rotational direction of the rotary table 2, specifically, toward the gap between the lower surface of the protrusion portion 81b and the front surface of the rotary table 2. Thus, the reaction gas and the separation gas are prevented from flowing into the third processing region P3 from a space below the high ceiling surface 45 located on the upstream side of the plasma generator 80 along the rotational direction of the rotary table 2. As described above, the protrusion portion 81b formed along the outer periphery of the lower surface of the frame member 81 is close to the front surface of the rotary table 2. Therefore, an internal pressure of the third processing region P3 can easily be kept high by the gas supplied from the plasma gas nozzle 33. This also prevents the reaction gas and the separation gas from flowing into the third processing region P3.

The Faraday shield plate 82 is made of a conductive material such as metal or the like and is grounded although not shown. As is apparent from FIG. 8, a plurality of slits 82s is formed in a bottom portion of the Faraday shield plate 82. Each of the slits 82s extends so as to be substantially orthogonal to the respective side of the antenna 85 having a substantially octagonal planar shape.

Furthermore, as shown in FIGS. 7 and 8, the Faraday shield plate 82 includes a support portion 82a bent outward at two positions at the upper end thereof. By supporting the support portion 82a on the upper surface of the frame member 81, the Faraday shield plate 82 is supported at a predetermined position inside the frame member 81.

The insulating plate 83 is made of, for example, quartz glass, has a size slightly smaller than that of a bottom surface of the Faraday shield plate 82, and is placed on the bottom surface of the Faraday shield plate 82. The insulating plate 83 insulates the Faraday shield plate 82 from the antenna 85 and transmits high frequency waves radiated from the antenna 85 downward.

The antenna 85 is formed by winding a copper-made hollow pipe, for example, in triplicate, to have a substantially octagonal planar shape. This makes it possible to circulate cooling water through the hollow pipe, thereby preventing the antenna 85 from being heated to a high temperature by the high frequency waves supplied to the antenna 85. In addition, the antenna 85 is provided with an upright portion 85a. A support portion 85b is attached to the upright portion 85a. The antenna 85 is held at a predetermined position inside the Faraday shutter plate 82 by the support portion 85b. A high frequency power supply 87 is coupled to the support portion 85b via a matching box 86. The high frequency power supply 87 can generate high frequency power having a frequency of, for example, 13.56 MHz.

According to the plasma generator 80 configured as above, when the high frequency power is supplied from the high frequency power supply 87 to the antenna 85 via the matching box 86, an electromagnetic field is generated by the antenna 85. Electric field components of the electromagnetic field are blocked by the Faraday shield plate 82 and cannot propagate downward. On the other hand, magnetic field components of the electromagnetic field propagate through the plurality of slits 82s of the Faraday shield plate 82 into the third processing region P3. By virtue of the magnetic field components, plasma is generated from the gases such as the Ar gas, the $O_2$ gas, the $NH_3$ gas and the like supplied from the plasma gas nozzle 33 to the third processing region P3 at a predetermined flow rate ratio (mixing ratio). According to the plasma generated in this manner, it is possible to reduce damage to a thin film deposited on the wafer W by irradiation, damage to each part inside the vacuum container 1, and the like.

In addition, as shown in FIG. 1, the film forming apparatus according to the present embodiment is provided with a control part 100 including a computer for controlling the overall operations of the apparatus. A memory of the control part 100 stores a program for causing the film forming apparatus to perform a below-described film forming method under the control of the control part 100. The program incorporates a group of steps so as to execute the film forming method. The program is stored in a medium 102 such as a hard disk, a compact disk, a magneto-optical disk, a memory card, a flexible disk or the like. The program is read in a memory part 101 by a predetermined reading device and is installed on the control part 100.

The control part 100 performs control for implementing the film forming method according to an embodiment of the present disclosure. As will be described in detail later, the rotation speed of the rotary table 2, the flow rate controller for adjusting the flow rate of the raw material gas to be supplied to the reaction gas nozzle 31, the type of the gas to be supplied to the plasma gas nozzle 33, and the like, are controlled according to a process to be performed.

[Film Forming Method]

Next, the film forming method according to an embodiment of the present disclosure will be described.

First Embodiment

FIGS. 9A to 9F are views for explaining an example of a film forming method according to a first embodiment of the present disclosure.

Figure 9A:
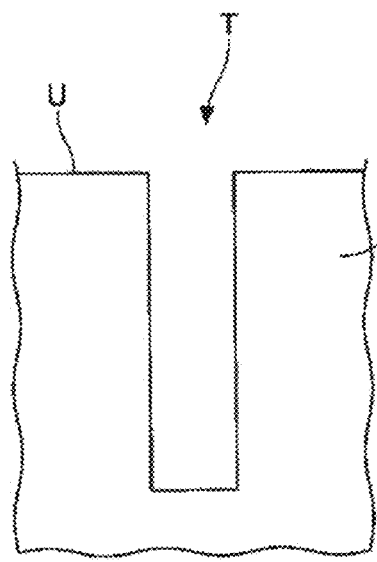

FIG. 9A is a sectional view showing an example of the front surface of the wafer W to which the film forming method according to the first embodiment is applied. In the present embodiment, an example in which a silicon wafer is used as the wafer W will be described. In the front surface of the wafer W, a trench T is formed as an example of a groove pattern. The groove pattern formed in the front surface of the wafer W is not limited to the trench T and may be a via hole or other special groove shapes. In the present embodiment, an example in which a film is embedded in the trench T will be described.

The film forming method according to the present embodiment includes two film forming processes, namely an in-conformal film forming process of depositing a film in the trench T while forming a V-like cross-sectional shape in an in-conformal fashion and a conformal film forming process of filling the trench T to the end by conformal film formation. That is to say, when filling the trench T, the in-conformal film forming process is performed until halfway and, then, the conformal film forming process is performed, thereby performing the final filling.

Incidentally, the in-conformal film formation or the in-conformal film forming process is intended to mean film formation in which a film is deposited from the bottom surface of a groove such as a trench T or the like while forming a V-like cross-sectional shape. The term in-conformal film formation or the in-conformal film forming process is used to distinguish itself from conformal film formation in which a film is formed at a substantially constant film thickness on the entire inner surface of the groove. In this regard, the in-conformal film formation and the in-conformal film forming process may be referred to as in-conformal film formation and an in-conformal film forming process, or film formation which is not conformal and a film forming process which is not conformal.

Figure 9B:
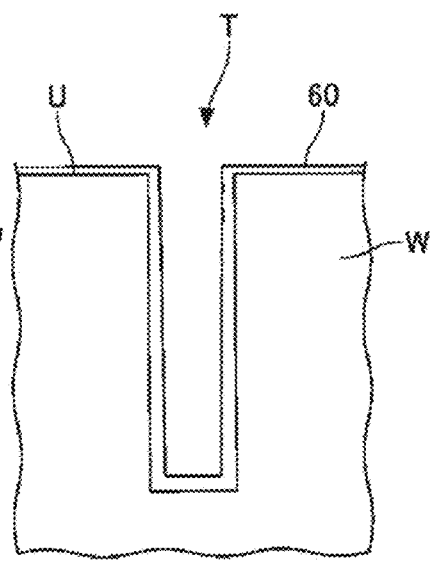

FIG. 9B is a sectional view showing an example of a film formation start step. In the start step, film formation for depositing a film 60 on an inner surface of the trench T is started. In the start step, the film 60 is formed on the entire inner surface of the trench T even if the in-conformal film formation is performed. In general, the in-conformal film formation conditions are more complex than the conformal film formation conditions. A film formation time is also set to be long. For example, in the case of a film forming apparatus that performs ALD (Atomic Layer Deposition) film formation using the rotary table 2 as in the film forming apparatus according to the present embodiment, the rotation speed of the rotary table 2 is set to be lower than that of the ordinary conformal film formation, and the flow rate of the raw material gas is set to be smaller than that of the ordinary conformal film formation. Specifically, in the case of the film forming apparatus described with reference to FIGS. 1 to 8, for example, if the rotation speed of the rotary table 2 is set to 20 rpm or less, it is often possible to perform in-conformal film formation. Therefore, the rotation speed of the rotary table 2 is set to 20 rpm or less.

Furthermore, in the case of performing the ALD film formation of one cycle in which the type of a gas to be supplied into a processing chamber is switched in the order of a raw material gas, a purge gas, a reaction gas and a purge gas, the flow rate of the raw material gas is set to a flow rate smaller than that of the ordinary conformal film formation, and a time period of one cycle is set to be long. In the case of CVD film formation, there is used a method in which low temperature CVD is carried out or film formation is selectively performed by forming adsorption-inhibiting groups using chlorine radicals.

As described above, in the in-conformal film forming process, film formation is started under a condition capable of performing in-conformal film formation having a high bottom-up property, while forming a V-like cross-sectional shape.

Figure 9C:
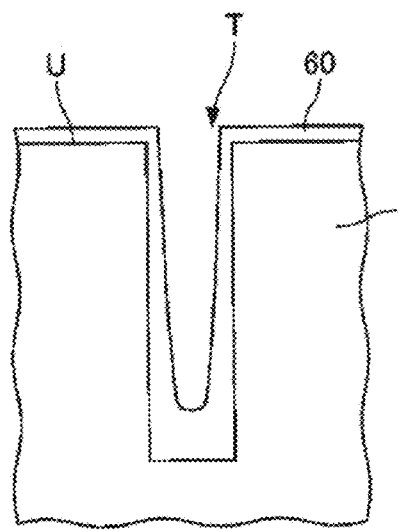

FIG. 9C is a sectional view showing an example of an initial film formation step. As the film formation progresses gradually from the start of film formation, the thickness of the film 60 increases. At this time, the features of the in-conform film formation begin to appear. That is to say, the thickness of the film 60 becomes thicker on the bottom surface of the trench T, and becomes thinner on the side surface and the upper portion of the trench T compared with the bottom surface. As a result, the cross-sectional shape of the film 60 is a V-like shape, and the opening of the upper portion of the trench T is not blocked and is largely opened. If such in-conformal film formation is continued, it is possible to fill the trench T while preventing generation of a void.

However, the in-conformal film formation is usually lower in deposition rate than the conformal film formation and requires much time in many cases. In addition, since the in-conformal film formation requires much time, a time period for allowing the reaction gas to flow also becomes long. Even if the flow rate is small, a large amount of gas tends to be consumed as a consequence.

Figure 9D:
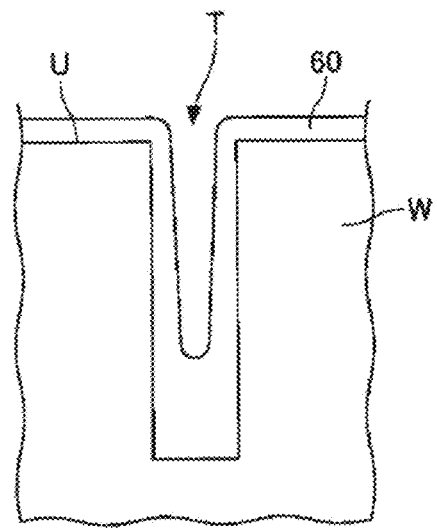

FIG. 9D is a view showing an example of a middle film formation step. If the in-conformal film formation is continued, it is possible to maintain the V-like cross-sectional shape of the film 60 even though the film thickness becomes thick, and it is possible to perform filling without closing the upper opening of the trench T, while preventing generation of a void. By continuing the in-conformal film formation as it is, it is possible to fill the trench without generating a void. However, it takes time to fill the trench T as a whole.

FIG. 9E is a view showing an example of a later film formation step. In the later film formation step, the in-conformal film formation is switched to the conformal film formation to perform the conformal film forming process. The conformal film formation is a step of depositing a film 60a having a uniform thickness on the front surface of the groove. In many cases, the conformal film formation is higher in the deposition rate of the film 60a than the in-conformal film formation.

For example, in the case of the rotary table type ALD film forming apparatus according to the present embodiment described with reference to FIGS. 1 to 8, if the rotation speed of the rotary table 2 is set to exceed 20 rpm, it becomes possible to perform the conformal film formation. Furthermore, the flow rate of the raw material gas can be made larger than that of the in-conformal film formation. As a result, it is possible to perform film formation in a short period of time and to improve the throughput.

In addition, even in the case of the apparatus that performs ALD film formation by switching the type of the gas to be supplied into the processing chamber, it is possible to shorten a time period required for one cycle and to improve the throughput by shortening the gas switching time. Even in the case of CVD (Chemical Vapor Deposition) film formation, low temperature CVD can be returned to ordinary high-temperature CVD. Since the deposition rate is high in the high-temperature film formation, it is possible to improve the throughput. In addition, when in-conformal film formation is performed using chlorine radicals, there is no need to perform a step of adsorbing the chlorine radicals. Therefore, it is possible to improve the throughput.

FIG. 9F is a view showing an example of a film formation completion step. In the film formation completion step, the trench T is filled to the end by the conformal film formation, thereby terminating the film formation. Since the deposition rate is high in the conformal film formation, the steps from FIG. 9E to FIG. 9F can be implemented in a short period of time, thus improving the throughput.

As described above, according to the film forming method of the present embodiment, by performing the in-conformal film formation and the conformal film formation in combination instead of performing the in-conformal film formation alone from the beginning to the end, it is possible to improve the productivity while suppressing generation of a void or the like. Furthermore, in the case of the rotary table type ALD film formation, it is possible to reduce the total consumption of the raw material gas and to reduce the cost. That is to say, film formation is carried out while forming a V-like cross-sectional shape by the in-conformal film formation till reaching a certain film thickness, thereby making a state in which generation of a void can be reliably suppressed. Thereafter, the conformal film formation having high productivity and low production cost is performed, whereby the productivity can be improved without deteriorating the quality of film formation.

In FIGS. 9A to 9F, there has been described the example in which the in-conformal film forming process of FIGS. 9A to 9D is carried out under the same film forming conditions. In some embodiments, in the steps of FIGS. 9A to 9C and the steps 9C to 9D, a two-stage in-conformal film forming process of changing the film forming conditions may be performed.

For example, in the initial film formation step shown in FIGS. 9A to 9C, it may be possible to adopt film forming conditions with a high bottom-up property capable of more reliably forming a V-like cross-sectional shape. In the middle film formation step shown in FIGS. 9C to 9D, it may be possible to adopt film forming conditions which fall within the category of the in-conformal film forming conditions and which are closer to the conformal film formation conditions. Specifically, it may be possible to perform film formation of three stages in which the rotation speed of the rotary table 2 is set to 5 rpm in the initial film formation steps shown in FIGS. 9A to 9C, the rotation speed of the rotary table 2 is set to 10 rpm in the middle film formation steps shown in FIGS. 9C to 9D, and the rotation speed of the rotary table 2 is set to 100 rpm higher than 20 rpm as the upper limit of the in-conformal film formation in the later film formation steps shown in FIGS. 9D to 9E.

The flow rate of the raw material gas may also be increased at three stages and may be set as conditions. The film forming conditions for the in-conformal film forming process and the conformal film forming process may be varied widely depending on the intended use. The in-conformal film forming process may be set to have two or more stages.

Next, there will be specifically described an embodiment in which the film forming method according to the embodiment of the present disclosure is applied to the film formation using the atomic layer deposition (Atomic Layer Deposition) through the use of the rotary table type film forming apparatus described with reference to FIGS. 1 to 8.

Second Embodiment

FIGS. 10A to 10D are views showing an in-conformal film forming process in an example of a film forming method according to a second embodiment of the present disclosure.

Also in the second embodiment, a silicon wafer is used as the wafer W, and a trench T is formed in the silicon wafer as shown in FIG. 9A. Furthermore, there will be described, by way of example, a case where DIPAS (diisopropylaminosilane) as one type of organic aminosilane gas is supplied from the reaction gas nozzle 31, an $O_3$ gas as an oxidizing gas is supplied from the reaction gas nozzle 32, a mixed gas of an Ar gas and an $O_2$ gas (hereinafter referred to as an Ar/$O_2$ gas) is supplied from the plasma gas nozzle 33 in the in-conformal film forming process, and a mixed gas of an Ar gas, an $O_2$ gas and a $H_2$ gas is supplied from the plasma gas nozzle 33 in the conformal film forming process. However, in FIGS. 10A to 10D, the shape of the trench T is simplified and only one side surface and the bottom surface are shown.

First, a gate valve (not shown) is opened, and the wafer W is delivered from the outside to the recess 24 of the rotary table 2 via the transfer port 15 (FIGS. 2 and 3) by the transfer arm 10 (FIG. 3). This delivery is carried out by raising and lowering the lift pins (not shown) from the bottom side of the vacuum container 1 via the respective through-holes of the bottom surface of the recess 24 when the recess 24 is located at a position facing the transfer port 15. Such delivery of the wafer W is performed by intermittently rotating the rotary table 2 so that the wafers W are mounted in the five recesses 24 of the rotary table 2, respectively.

Subsequently, the gate valve is closed, and the interior of the vacuum container 1 is evacuated to a reachable degree of vacuum by the vacuum pump 640. Thereafter, an $N_2$ gas as a separation gas is discharged from each of the separation gas nozzles 41 and 42 at a predetermined flow rate. An $N_2$ gas is also discharged from each of the separation gas supply pipe 51 and the purge gas supply pipe 72 at a predetermined flow rate. Along with this, the internal pressure of the vacuum container 1 is controlled to a preset processing pressure by the pressure control means 650 (FIG. 1). Subsequently, while rotating the rotary table 2 in a clockwise direction at a rotation speed of 20 rpm or less, for example, a rotation speed of 5 rpm, the wafer W is heated to, for example, 400 degrees C. by the heater unit 7.

Thereafter, DIPAS is supplied from the reaction gas nozzle 31 (FIGS. 2 and 3), and the $O_3$ gas is supplied from the reaction gas nozzle 32. The DIPAS is supplied at a flow rate of 100 sccm or less, for example at a flow rate of 50 sccm. Furthermore, the Ar/$O_2$ gas is supplied from the plasma gas nozzle 33, and a high frequency wave having a frequency of 13.56 MHz is supplied to the antenna 85 of the plasma generator 80 at an electric power of, for example, 1,400 W. Thus, oxygen plasma is generated in the third processing region P3 between the plasma generator 80 (FIG. 6) and the rotary table 2. Active species such as oxygen ions or oxygen radicals and high energy particles are generated in this oxygen plasma.

With the rotation of the rotary table 2, the wafer W repeatedly passes through the first processing region P1, the separation region D, the second processing region P2, the third processing region P3 (a region below the third processing region P3) and the separation region D in this order (see FIG. 3).

FIG. 10A is a view showing an example of a first raw material gas adsorption step. As shown in FIG. 10A, in the first processing region P1, DIPAS as a raw material gas is supplied from the reaction gas nozzle 31. Molecules of DIPAS are adsorbed onto a front surface U of the wafer W and the inner surface of the trench T, whereby a DIPAS molecule layer 61 (see the lower view) is formed.

Thereafter, with the rotation of the rotary table 2, the wafer W passes through the separation region D and reaches the second processing region P2.

FIG. 10B is a view showing an example of an oxidation step. As shown in FIG. 10B, in the second processing region P2, the DIPAS adsorbed onto the front surface U of the wafer W and the inner surface of the trench T is oxidized by the $O_3$ gas, such that a silicon oxide film 62 is formed along the inner surface of the trench T (see the lower view). When the DIPAS is oxidized, OH groups are generated as a by-product. The generated OH groups are adsorbed onto a front surface of the silicon oxide film 62.

FIG. 10C is a view showing an example of a modification step. When the wafer W reaches the third processing region P3 below the plasma generator 80 with the rotation of the rotary table 2, the wafer W is exposed to the oxygen plasma. At this time, some of the OH groups adsorbed onto the silicon oxide film 62 are desorbed from the silicon oxide film 62 due to collision of, for example, high-energy particles existing in the oxygen plasma. Although the oxygen plasma reaches the front surface U of the wafer W or the vicinity of the opening of the trench T, it is difficult for the oxygen plasma to reach the vicinity of the bottom portion of the trench T. For this reason, a relatively large amount of OH groups are desorbed from the front surface U of the wafer W and the side surface of the trench T near the opening thereof. As a result, as shown in FIG. 10C, the OH groups are distributed so that the density of the OH groups is high in the bottom portion and the side surface near the bottom portion of the trench T and so that the density of the OH groups is lowered toward the opening of the trench T and the front surface U of the wafer W. The silicon oxide film 62 from which the OH groups have been desorbed is shown as a silicon oxide film 62a in the lower view of FIG. 10C.

FIG. 10D is a view showing an example of a second raw material gas adsorption step. When the wafer W reaches the first processing region P1 again with the rotation of the rotary table 2, the molecules of DIPAS supplied from the reaction gas nozzle 31 are adsorbed onto the front surface U of the wafer W and the inner surface of the trench T, whereby a DIPAS molecule layer 61 is formed. At this time, as shown in FIG. 10D, the molecules of DIPAS are adsorbed onto the front surface U of the wafer W and the inner surface of the trench T in a distribution corresponding to the distribution of OH groups, because the molecules of DIPAS are easily adsorbed to the OH groups. That is to say, the molecules of DIPAS are adsorbed onto the inner surface of the trench T so that the density of the molecules of DIPAS is high in the bottom portion and the side surface near the bottom portion of the trench T and so that the density of the molecules of DIPAS is lowered toward the opening of the trench T.

Subsequently, when the wafer W passes through the second processing region P2, the organic aminosilane gas adsorbed onto the front surface U of the wafer W and the inner surface of the trench T is oxidized by the $O_3$ gas, whereby a silicon oxide film 62 is further formed as described in FIG. 10B. The film thickness distribution of the silicon oxide film 62 reflects the density of the DIPAS adsorbed onto the inner surface of the trench T. That is to say, the silicon oxide film 62 is thick in the bottom portion and the side surface near the bottom portion of the trench T and becomes thinner toward the opening of the trench T. Then, the OH groups generated by the oxidation of DIAPS adsorbs onto the front surface of the silicon oxide film 62.

Next, when the wafer W reaches the third processing region P3 below the plasma generator 80 again, as described in FIG. 10C, the OH groups are distributed so that the density of the OH groups is high in the bottom portion and the side surface near the bottom portion of the trench T and is lowered toward the opening of the trench T.

Thereafter, as the above process repeats, the silicon oxide film 62 becomes thicker from the bottom portion of the trench T as shown in FIG. 10D. Then, as described with reference to FIGS. 9A to 9D, the film 60 can be deposited in the trench T while forming a V-like cross-sectional shape. FIGS. 10A to 10C constitute one cycle of the in-conformal film forming process in the ALD film formation.

For example, it is possible to carry out the in-conformal film forming process by such a film forming method.

Thereafter, a conformal film forming process is carried out.

FIGS. 11A to 11C are views showing the conformal film forming process in an example of the film forming method according to the second embodiment of the present disclosure. In FIGS. 11A to 11C, for the sake of convenience in description, description will be made by taking an example in which the film deposited in the in-conformal film forming process is not reflected and a film is formed on a surface of the trench T through the conformal film forming process.

Before performing the conformal film forming process, the rotation speed of the rotary table 2 is increased. As long as the rotation speed of the rotary table 2 exceeds 20 rpm, various rotation speeds may be set depending on the intended use. For example, the rotation speed of the rotary table 2 is set to 120 rpm. Then, the flow rate of DIPAS supplied from the reaction gas nozzle 31 is increased. The flow rate of DIPAS may be set to various values depending on the intended use and may be set to a value of, for example, 200 sccm or more. Description will now be made on an example in which the flow rate of DIPAS is set to 300 sccm. Furthermore, a hydrogen gas is added to the plasma gas supplied from the plasma gas nozzle 33. That is to say, although the mixed gas of Ar and $O_2$ is supplied in the in-conformal film forming process, a mixed gas of Ar, $O_2$ and $H_2$ is supplied in the conformal film forming process. The flow rate of $H_2$ may be set to various flow rates depending on the intended use. For example, when the flow rate of oxygen is 75 sccm, the flow rate of $H_2$ may be set to 45 sccm.

As described above, the conformal film forming process is performed after changing the film forming conditions to the conditions for performing the conformal film forming process.

FIG. 11A is a view showing an example of a raw material adsorption step. As shown in FIG. 11A, in the first processing region P1, DIPAS as a raw material gas is supplied from the reaction gas nozzle 31. Molecules of DIPAS are adsorbed onto the front surface U of the wafer W and the inner surface of the trench T, whereby a DIPAS molecule layer 61 (see the lower view) is formed. This step is the same as the raw material adsorption step in the in-conformal film forming process. However, DIPAS is adsorbed onto the inner surface of the trench T at a higher density because the flow rate of DIPAS is increased.

FIG. 11B is a view showing an example of an oxidation step. The oxidation step in the conformal film forming process is entirely the same as the oxidation step in the in-conformal oxidation step. That is to say, as shown in FIG. 11B, in the second processing region P2, the DIPAS adsorbed onto the front surface U of the wafer W and the inner surface of the trench T is oxidized by the $O_3$ gas, whereby a silicon oxide film 62 (see the lower view) is formed along the inner surface of the trench T. When the DIPAS is oxidized, OH groups are generated as a by-product. The generated OH groups are adsorbed onto a front surface of the silicon oxide film 62.

FIG. 11C is a view showing an example of a modification step. In the modification step, the wafer W reaches the third processing region P3 where the wafer W is exposed to oxygen plasma. At this time, the oxygen plasma contains the OH groups generated from the hydrogen gas. Therefore, even if the OH groups adsorbed onto the silicon oxide film 62 are desorbed by the oxygen plasma. OH groups generated by the oxygen plasma and the hydrogen plasma may be adsorbed again. Accordingly, as compared with the case where only the $Ar/O_2$ gas described with reference to FIG. 10C is used, it is possible to suppress the reduction of OH groups on the front surface U of the wafer W and in the vicinity of the opening of the trench T. Thus, as shown in FIG. 11C, the distribution of the OH groups is made uniform on the inner surface of the trench T. That is to say, the OH groups adsorbs not only onto the periphery of the bottom surface of the trench T but also onto the upper portion of the trench T and the front surface U of the wafer W. As a result, the adsorption sites of DIPAS are formed over the entire surface. Therefore, in the modification step, it is possible to create the same surface condition as in FIG. 11B.

Therefore, when the wafer W reaches the first processing region P1 again, as shown in FIG. 11A, the molecules of DIPAS supplied from the reaction gas nozzle 31 are uniformly adsorbed onto the inner surface of the trench T. Therefore, as shown in FIG. 11B, the silicon oxide film 62 formed by oxidizing the adsorbed organic aminosilane gas with the $O_3$ gas may also be uniformly formed on the inner surface of the trench T.

For example, the conformal film forming process is carried out in this way. In the conformal film forming process, the rotation speed of the rotary table 2 is high and the flow rate of DIPAS as a raw material gas is also increased. Therefore, one cycle of FIGS. 11A to 11C is performed at a higher speed than one cycle of FIGS. 10A to 10C, which makes it possible to increase the deposition rate of the film 62.

By performing such a conformal film forming process after the in-conformal film forming process, it is possible to embed a conformal film on the V-shaped film 60 at a high speed, and to improve the overall deposition rate without generating a void.

In the film forming method according to the present embodiment, there has been described the example where DIPAS is used as a raw material gas. However, other organic aminosilane gases or silicon-containing gases may be used. As for the oxidizing gas, in addition to ozone, various oxidizing gases such as $O_2$, $H_2O$, $H_2O_2$ and the like may be used depending on the intended use.

Furthermore, the processes described with reference to FIGS. 10A to 10D and FIGS. 11A to 11C may also be applied to the ALD film formation in which the gases to be supplied into the processing chamber are switched.

Furthermore, the film forming method described with reference to FIGS. 9A to 9F may be applied to formation of films other than the silicon oxide film and film formation other than the film formation using the ALD film forming apparatus.

According to the film forming method of the present embodiment, it is possible to embed a film in a groove without generating a defect such as a void or the like and to improve the productivity.

EXAMPLES

Next, examples in which the film forming method according to the second embodiment is carried out will be described.

Examples 1 to 3

In Examples 1 to 3, the film forming method described in the second embodiment was carried out using the rotary table type ALD film forming apparatus described with reference to FIGS. 1 to 8. As the film forming conditions, the temperature of the wafer W was set to 400 degrees C. and the internal pressure of the vacuum container 1 was set to 6.7 Torr. Furthermore, the flow rate of oxygen supplied from the plasma gas nozzle 33 was set to 75 sccm. In the in-conformal film forming process, the flow rate of DIPAS as a raw material gas was set to 50 sccm, and no hydrogen gas was supplied from the plasma gas nozzle 33. Moreover, in the conformal film forming process, the flow rate of DIPAS as a raw material gas was set to 300 sccm. Oxygen was supplied at 75 sccm and hydrogen was supplied at 45 sccm from the plasma gas nozzle 33. In the in-conformal film forming process, the rotation speed of the rotary table 2 was set to 5 rpm. In the conformal film forming process, the rotation speed of the rotary table 2 was set to 120 rpm. Then, embedment was performed until reaching 2,000 Å as a whole. In Example 1, the in-conformal film forming process was performed until reaching 200 Å, and the conformal film forming process was performed until reaching the remaining 1,800 Å. In Example 2, the in-conformal film forming process was performed until reaching 100 Å, and the conformal film forming process was performed until reaching the remaining 1,900 Å. In Example 3, the in-conformal film forming process was performed until reaching 50 Å, and the conformal film forming process was performed until reaching the remaining 1,950 Å.

In Comparative Example 1, embedment was performed until reaching 2,000 Å in the in-conformal film forming process.

Figure 12:
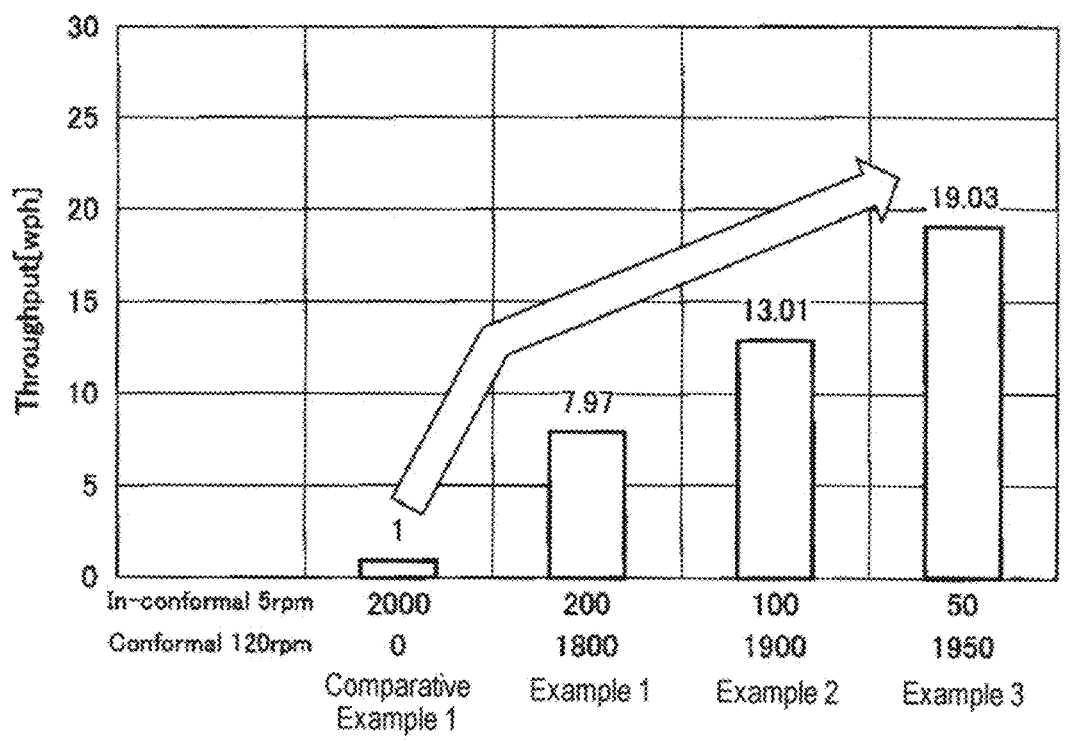
FIG. 12 is a diagram showing the implementation results of Examples 1 to 3 and Comparative Example 1 in terms of the throughput.

FIG. 12 is a diagram showing the implementation results of Examples 1 to 3 and Comparative Example 1 in terms of throughput. In FIG. 12, the horizontal axis indicates the film deposition amount (A) in the in-conformal film forming process and the conformal film forming process, and the vertical axis indicates the throughput (wph). The throughput in Comparative Example 1 is assumed to be 1, and the degree of improvement of the throughput (wph) in Examples 1 to 3 with respect to that in Comparative Example 1 is indicated.

As shown in FIG. 12, if it is assumed that the throughput in Comparative Example 1 which performs embedment until reaching 2,000 Å as a whole through the in-conformal film forming process is 1 wph, the throughput in Example 1 in which the in-conformal film forming process was performed until reaching 200 Å and the conformal film forming process was performed until reaching 1,800 Å was 7.97 times as large as the throughput in Comparative Example 1. Furthermore, the throughput in Example 2 in which the in-conformal film forming process was performed until reaching 100 Å and the conformal film forming process was performed until reaching 1,900 Å was improved to become 13.01 times as large as the throughput in Comparative Example 1. Moreover, the throughput in Example 3 in which the in-conformal film forming process was performed until reaching 50 Å and the conformal film forming process was performed until reaching 1,950 Å was improved to become 19.03 times as large as the throughput in Comparative Example 1.

Thus, it can be seen from the results of Examples 1 to 3 that the productivity can be reliably improved by decreasing the ratio of the in-conformal film forming process and increasing the ratio of the conformal film forming process.

Figure 13:
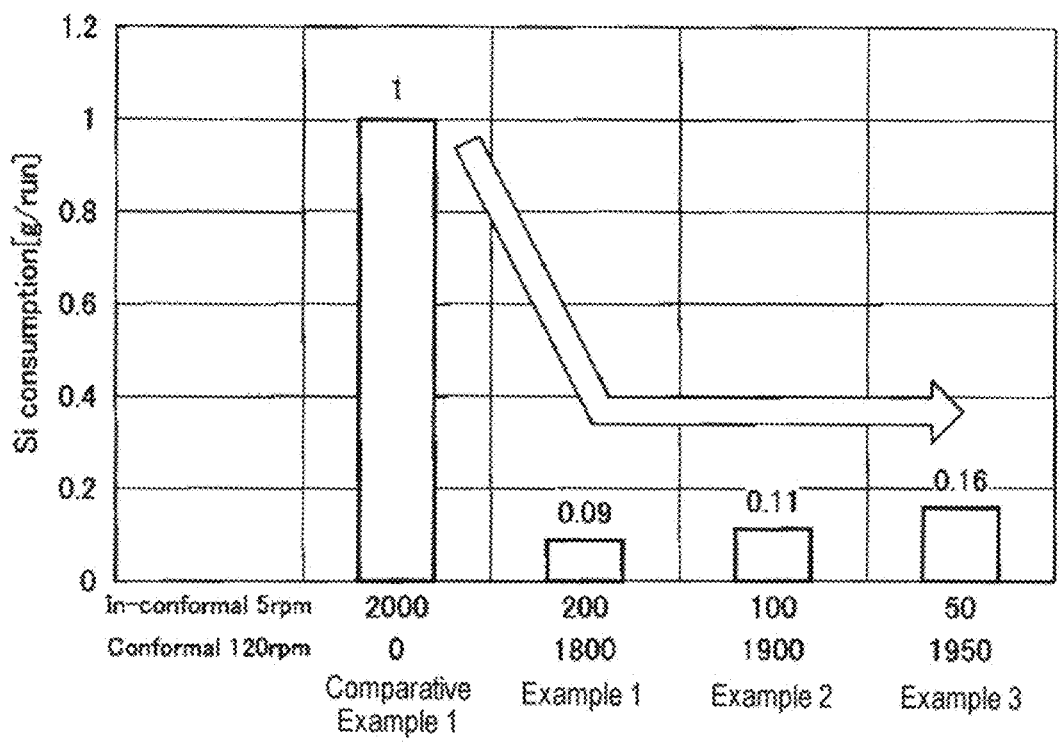
FIG. 13 is a diagram showing the implementation results of Examples 1 to 3 and Comparative Example 1 in terms of the Si consumption.

FIG. 13 is a diagram showing the implementation results of Examples 1 to 3 and Comparative Example 1 in terms of the Si consumption. In FIG. 13, the horizontal axis indicates the film deposition amount (A) in the in-conformal film forming process and the conformal film forming process, and the vertical axis indicates the Si consumption (g/run). The Si consumption in Comparative Example 1 is assumed to be 1, and the degree of Si consumption in Examples 1 to 3 with respect to the Si consumption in Comparative Example 1 is indicated.

As shown in FIG. 13, if it is assumed that the Si consumption in Comparative Example 1 which performs embedment until reaching 2,000 Å as a whole through the in-conformal film forming process is 1, the Si consumption in Example 1 in which the in-conformal film forming process was performed until reaching 200 Å and the conformal film forming process was performed until reaching 1,800 Å was 0.09 (9/100) times as large as the Si consumption in Comparative Example 1. Furthermore, the Si consumption in Example 2 in which the in-conformal film forming process was performed until reaching 100 Å and the conformal film forming process was performed until reaching 1,900 Å was 0.11 (11/100) times as large as the Si consumption in Comparative Example 1. The Si consumption in Example 3 in which the in-conformal film forming process was performed until reaching 50 Å and the conformal film forming process was performed until reaching 1,950 Å was 0.16 (16/100) times as large as the Si consumption in Comparative Example 1.

Thus, it can be seen from the results of Examples 1 to 3 that according to the film forming method of the present embodiment, it is possible to reduce the Si consumption to about 1/10, thereby achieving cost reduction.

Examples 4 to 6

In Examples 4 to 6, the rotation speed of the rotary table 2 in the in-conformal film forming process was set to 20 rpm which is faster than that in Examples 1 to 3. Other conditions are the same as those in Examples 1 to 3. In Comparative Example 2, the rotation speed of the rotary table 2 was set to 20 rpm at which embedment was performed until reaching 2,000 Å as a whole. Other conditions are the same as those in Comparative Example 1.

Figure 14:
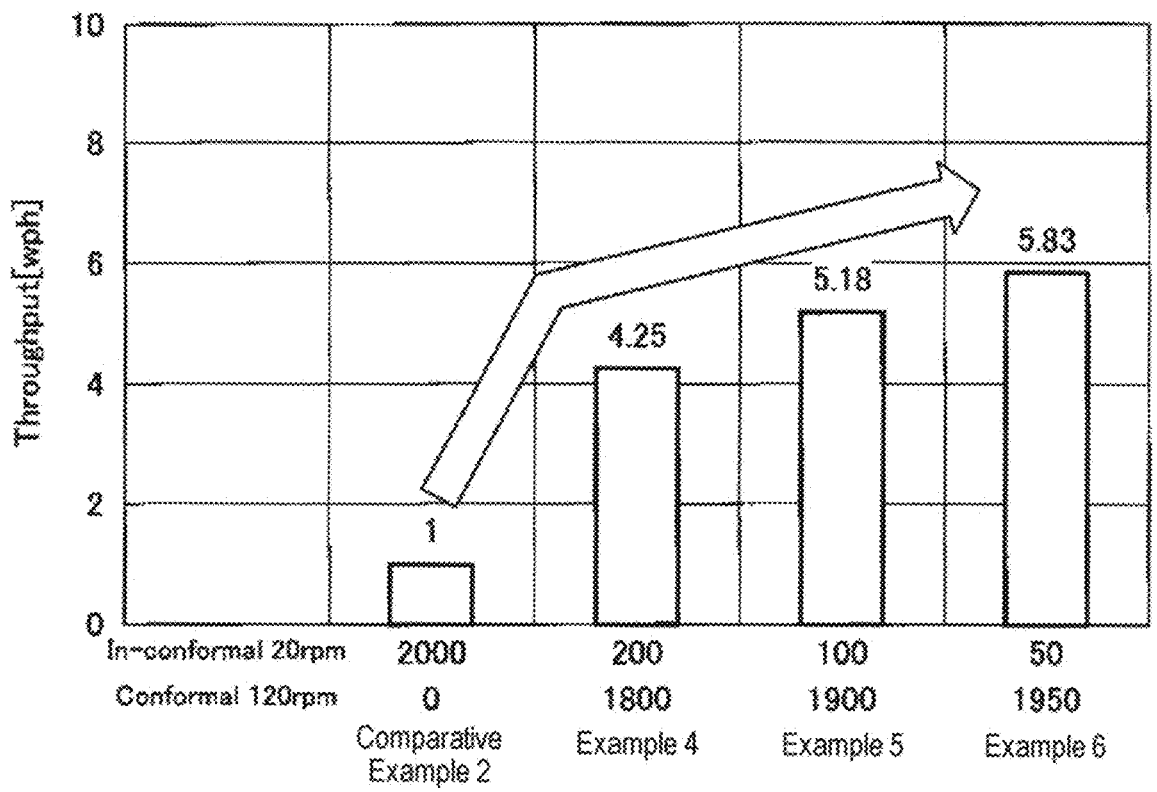
FIG. 14 is a diagram showing the implementation results of Examples 4 to 6 and Comparative Example 2 in terms of the throughput.

FIG. 14 is a diagram showing the implementation results of Examples 4 to 6 and Comparative Example 2 in terms of throughput. In FIG. 14, the horizontal axis indicates the film deposition amount (A) in the in-conformal film forming process and the conformal film forming process, and the vertical axis indicates the throughput (wph). The throughput in Comparative Example 2 is assumed to be 1, and the degree of improvement of the throughput (wph) in Examples 4 to 6 with respect to that in Comparative Example 2 is indicated.

As shown in FIG. 14, if it is assumed that the throughput in Comparative Example 2 which performs embedment until reaching 2,000 Å as a whole through the in-conformal film forming process is 1 wph, the throughput in Example 4 in which the in-conformal film forming process was performed until reaching 200 Å and the conformal film forming process was performed until reaching 1,800 Å was 4.25 times as large as the throughput in Comparative Example 2. Furthermore, the throughput in Example 5 in which the in-conformal film forming process was performed until reaching 100 Å and the conformal film forming process was performed until reaching 1,900 Å was improved to become 5.18 times as large as the throughput in Comparative Example 2. Moreover, the throughput in Example 6 in which the in-conformal film forming process was performed until reaching 50 Å and the conformal film forming process was performed until reaching 1,950 Å was improved to become 5.83 times as large as the throughput in Comparative Example 2.

Thus, it can be seen from the results of Examples 4 to 6 that even if the condition of the rotation speed in the in-conformal film forming process is changed, the productivity can be reliably improved by decreasing the ratio of the in-conformal film forming process and increasing the ratio of the conformal film forming process.

Figure 15:
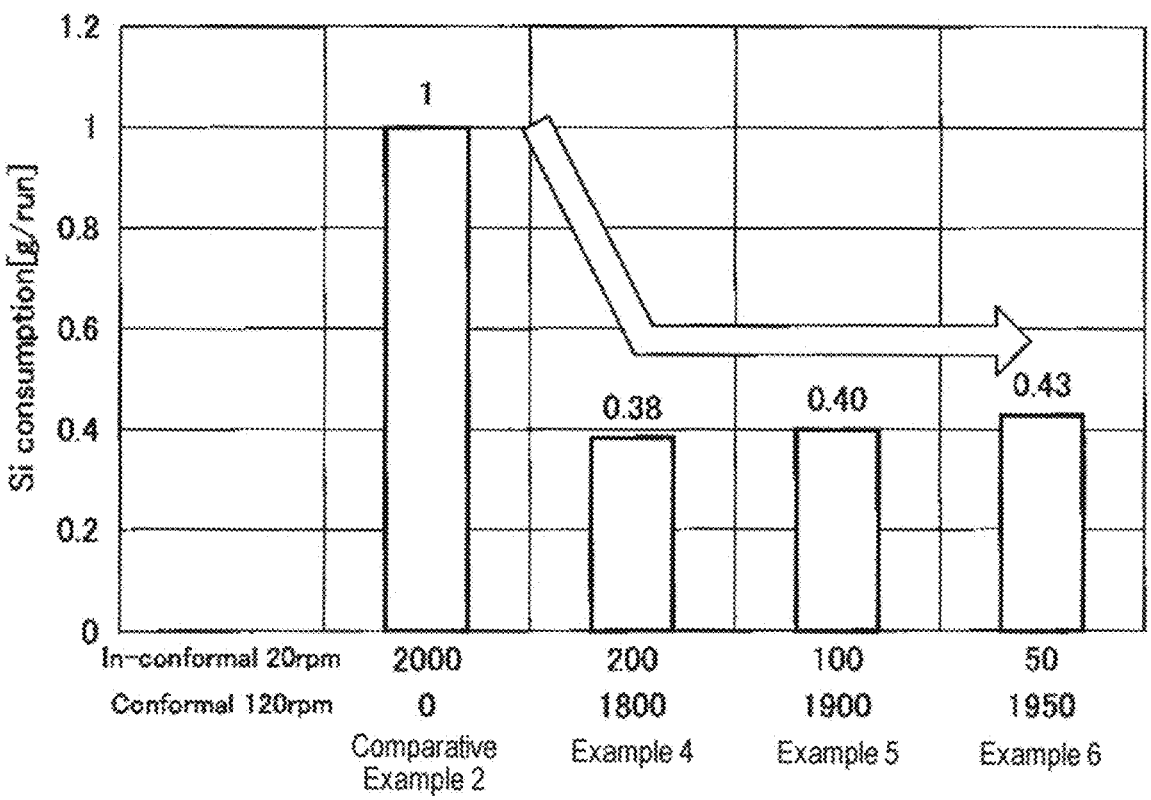
FIG. 15 is a diagram showing the implementation results of Examples 4 to 6 and Comparative Example 2 in terms of the Si consumption.

FIG. 15 is a diagram showing the implementation results of Examples 4 to 6 and Comparative Example 2 in terms of the Si consumption. In FIG. 15, the horizontal axis indicates the film deposition amount (A) in the in-conformal film forming process and the conformal film forming process, and the vertical axis indicates the Si consumption (g/run). The Si consumption in Comparative Example 2 is assumed to be 1, and the degree of Si consumption in Examples 4 to 6 with respect to the Si consumption in Comparative Example 2 is indicated.

As shown in FIG. 15, if it is assumed that the Si consumption in Comparative Example 2 which performs embedment until reaching 2,000 Å as a whole through the in-conformal film forming process is 1, the Si consumption in Example 4 in which the in-conformal film forming process was performed until reaching 200 Å and the conformal film forming process was performed until reaching 1,800 Å was 0.38 (38/100) times as large as the Si consumption in Comparative Example 2. Furthermore, the Si consumption in Example 5 in which the in-conformal film forming process was performed until reaching 100 Å and the conformal film forming process was performed until reaching 1,900 Å was 0.40 (40/100) times as large as the Si consumption in Comparative Example 2. The Si consumption in Example 6 in which the in-conformal film forming process was performed until reaching 50 Å and the conformal film forming process was performed until reaching 1,950 Å was 0.43 (43/100) times as large as the Si consumption in Comparative Example 2.

Thus, it can be seen from the results of Examples 4 to 6 that according to the film forming method of the present embodiment, even if the rotation speed in the in-conformal film forming process is slightly increased, it is possible to reduce the Si consumption to about 4/10, thereby achieving cost reduction.

Example 7

Figure 16A:
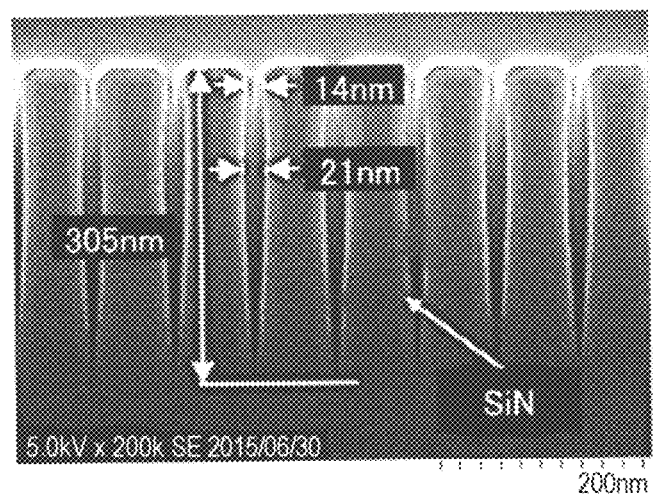
FIGS. 16A to 16C are images showing the implementation result of Example 7.
Figure 16B:
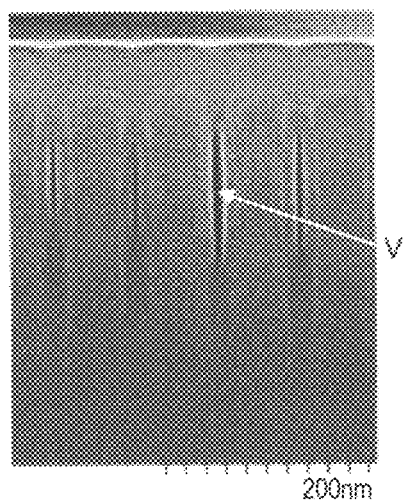
Figure 16C:
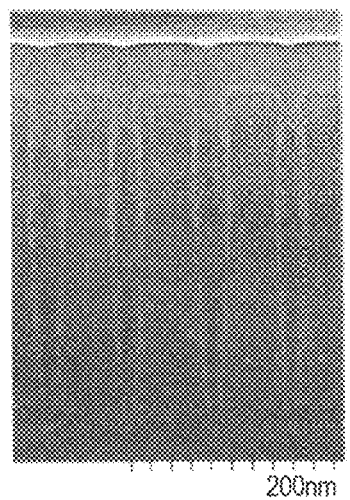

FIGS. 16A to 16C are images showing the implementation results of Example 7. FIG. 16A is a view showing the shape of a trench used for embedment. The trench had a depth of 305 nm. The width of an upper end opening of the trench was 14 nm, and the width of an opening of the trench at a position somewhat above the center was 21 nm.

FIG. 16B is an image showing the result of film formation when embedment was performed until reaching 50 nm only by the conformal film formation. In this case, in view of the conformal film formation, the rotation speed of the rotary table 2 was set to 120 rpm. In this case, although the productivity is not problematic, a void was generated, resulting in a problem with embedment characteristics.

FIG. 16C shows an example in which the film forming method according to the second embodiment was carried out. In this example, an in-conformal film forming process was carried out to perform embedment until reaching 10 nm at a rotation speed of 20 rpm, and a conformal film forming process was carried out to perform embedment until reaching 40 nm at a rotation speed of 120 rpm. As a result, it was possible to fill the trench without generating a void.

Thus, it can be noted from Example 7 that according to the film forming method of the present embodiment, embedment-based film formation can be performed with high productivity without generating a void.

According to the present disclosure in some embodiments, it is possible to improve the productivity while suppressing generation of a void in embedment-based film formation.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method of embedding a film in a groove formed in a front surface of a substrate disposed on a rotary table provided inside a processing chamber of a film forming apparatus and onto which a raw material gas is supplied in the processing chamber, the method comprising:
depositing an in-conformal film in the groove formed in the front surface of the substrate while forming a V-like cross-sectional shape in the groove; and
embedding a conformal film in the groove by depositing the conformal film,
wherein the depositing the in-conformal film includes a first in-conformal film forming step and a second in-conformal film forming step,
wherein a rotation speed of the rotary table is set to be higher in the second in-conformal film forming step than in the first in-conformal film forming step,
wherein a flow rate of the raw material gas is set to be higher in the second in-conformal film forming step than in the first in-conformal film forming step,
wherein the rotation speed of the rotary table is set to be higher in the depositing the conformal film than in the second in-conformal film forming step, and
wherein the flow rate of the raw material gas is set to be higher in the depositing the conformal film than in the second in-conformal film forming step.

2. The method of claim 1, wherein a deposition rate in the second in-conformal film forming step is higher than a deposition rate in the first in-conformal film forming step.

3. The method of claim 1, wherein the depositing the in-conformal film and the embedding the conformal film are performed by an atomic layer deposition method.

4. The method of claim 3, wherein a cycle time in the atomic layer deposition method is shorter in the embedding the conformal film than in the depositing the in-conformal film.

5. The method of claim 3, wherein a raw material gas adsorption region, a reaction region and a modification region are provided above the rotary table so as to be spaced apart from each other along a rotational direction of the rotary table,
the method further comprising: performing one cycle of the atomic layer deposition method, the one cycle including:
a raw material adsorption step of supplying the raw material gas onto the substrate and allowing the raw material gas to be adsorbed onto a surface of the groove of the substrate when the substrate passes through the raw material gas adsorption region by rotating the rotary table;
a reaction product deposition step of supplying a reaction gas which reacts with the raw material gas to form a reaction product onto the substrate and depositing the reaction product on the surface of the groove when the substrate passes through the reaction region; and
a modification step of performing a plasma modification on the reaction product when the substrate passes through the modification region.

6. The method of claim 5, wherein the depositing the in-conformal film is performed until the film has the predetermined film thickness, and the embedding the conformal film is performed until the groove is fully filled.

7. The method of claim 5, wherein the raw material adsorption step includes allowing a silicon-containing gas to be absorbed onto the surface of the groove,
the reaction product deposition step includes supplying an oxidizing gas onto the substrate to oxidize the silicon-containing gas adsorbed onto the surface of the groove, and
the modification step includes activating a mixture gas containing an oxygen with a plasma and supplying the activated mixture gas onto the substrate.

8. The method of claim 7, wherein the modification step in the depositing the in-conformal film is performed using the mixture gas not containing a hydrogen, and
the modification step in the embedding the conformal film is performed using the mixture gas containing a hydrogen.

9. The method of claim 7, wherein the silicon-containing gas is an organic aminosilane gas.

* * * * *